(12) United States Patent
Sun et al.

(10) Patent No.: US 8,928,080 B2
(45) Date of Patent: Jan. 6, 2015

(54) FIELD-EFFECT TRANSISTOR HAVING BACK GATE AND METHOD OF FABRICATING THE SAME

(75) Inventors: Min-Chul Sun, Seoul (KR); Byung-Gook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/554,066

(22) Filed: Jul. 20, 2012

(65) Prior Publication Data

US 2013/0140612 A1  Jun. 6, 2013

(30) Foreign Application Priority Data

Dec. 6, 2011 (KR) .................. 10-2011-0129558

(51) Int. Cl.
*H01L 27/12* (2006.01)

(52) U.S. Cl.
USPC .................................. 257/347; 257/E27.112

(58) Field of Classification Search
None
See application file for complete search history.

(56) References Cited

U.S. PATENT DOCUMENTS

| | | | |
|---|---|---|---|
| 6,383,904 B1 * | 5/2002 | Yu .................................. 438/589 |
| 6,433,609 B1 * | 8/2002 | Voldman ....................... 327/313 |
| 7,427,788 B2 | 9/2008 | Li et al. |
| 7,452,778 B2 | 11/2008 | Chen et al. |
| 7,456,476 B2 | 11/2008 | Hareland et al. |
| 7,560,756 B2 | 7/2009 | Chau et al. |
| 7,902,014 B2 | 3/2011 | Doyle et al. |
| 7,968,935 B2 | 6/2011 | Hong et al. |
| 8,064,249 B2 | 11/2011 | Jang et al. |
| 2004/0217433 A1 * | 11/2004 | Yeo et al. ....................... 257/412 |
| 2005/0275010 A1 * | 12/2005 | Chen et al. ..................... 257/315 |
| 2007/0063304 A1 | 3/2007 | Matsumoto et al. |
| 2007/0164344 A1 | 7/2007 | Park et al. |
| 2008/0061351 A1 | 3/2008 | Jang et al. |
| 2008/0128705 A1 * | 6/2008 | Ishiguro ........................... 257/72 |
| 2008/0224224 A1 * | 9/2008 | Vandenderghe et al. ..... 257/365 |
| 2011/0108942 A1 * | 5/2011 | Fenouillet-Beranger et al. ............................. 257/503 |
| 2011/0133161 A1 | 6/2011 | Bangsaruntip et al. |
| 2011/0187412 A1 * | 8/2011 | Ma et al. ........................ 326/112 |
| 2013/0001690 A1 * | 1/2013 | Zhu et al. ...................... 257/347 |
| 2013/0009244 A1 * | 1/2013 | Zhu et al. ...................... 257/347 |

FOREIGN PATENT DOCUMENTS

| | | |
|---|---|---|
| JP | 2009-252798 | 10/2009 |
| JP | 2010-135471 | 6/2010 |
| JP | 2010-192599 | 9/2010 |
| KR | 10-0745769 | 7/2007 |
| KR | 10-2011-0064704 | 6/2011 |

OTHER PUBLICATIONS

M.-C. Sun, et al. "Modulation of Transfer Characteristics of Si Nanowire Tunnel FET on Ultra-Thin-Body and BOX (UTBB) SOI Substrate Using Back-Gate Bias," ISDRS 2011, Dec. 7-9, 2011, College Park, MD, USA.

* cited by examiner

*Primary Examiner* — Eva Y Montalvo
*Assistant Examiner* — Kevin Quinto
(74) *Attorney, Agent, or Firm* — Onello & Mello, LLP

(57) ABSTRACT

A back-bias region is disposed on a substrate. A buried insulating layer covers the substrate and the back-bias region. A body is formed on the buried insulating layer and partially overlaps the back-bias region. A drain is in contact with the body. A gate electrode covers top and lateral surfaces of the body.

13 Claims, 26 Drawing Sheets

FIELD-EFFECT TRANSISTOR HAVING BACK GATE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2011-0129558 filed on Dec. 6, 2011, the entire contents of which are incorporated herein by reference.

BACKGROUND

1. Field

Example embodiments of the inventive concepts relate to a field-effect transistor (FET) having a back gate and a method of fabricating the same.

2. Description of Related Art

Research has been conducted on various methods for controlling a threshold voltage $V_T$ of a transistor.

SUMMARY

Example embodiments of the inventive concepts provide a semiconductor device configured to easily control a threshold voltage $V_T$ of a transistor.

Other example embodiments of the inventive concepts provide methods of fabricating a semiconductor device configured to easily control a threshold voltage $V_T$ of a transistor.

The technical objectives of the inventive concepts are not limited to the above concepts; other objectives may become apparent to those of ordinary skill in the art based on the following descriptions.

In accordance with an aspect of the inventive concepts, a semiconductor device is provided. The device includes a back-bias region on a substrate. A buried insulating layer covers the substrate and the back-bias region. A body is on the buried insulating layer and partially overlaps the back-bias region. A drain is in contact with the body. A gate electrode covers top and lateral surfaces of the body.

In one example embodiment, the back-bias region and drain may be spaced apart in a horizontal direction so that the back-bias region does not overlap the drain. In another example embodiment, a length of an overlap region between the back-bias region and the body may be less than half a length of the body. In another example embodiment, the back-bias region may be spaced at least 10 nm apart from a contact surface between the drain and the body in a horizontal direction.

In one example embodiment, the body may be a hemi-cylindrical nanowire.

In one example embodiment, a bottom surface of the body may have a width greater than a width of a top surface of the body.

In one example embodiment, a source may be in contact with the body and spaced apart from the drain. In another example embodiment, the source may overlap the back-bias region.

In another example embodiment, the drain may include N-type impurities, and the source may include P-type impurities.

In accordance with another aspect of the inventive concepts, a semiconductor device is provided. The device includes a back-bias region on a substrate. A buried insulating layer covers the substrate and the back-bias region. A hemi-cylindrical nanowire is on the buried insulating layer and is configured to overlap the back-bias region. A gate electrode is on the hemi-cylindrical nanowire.

In one example embodiment, the back-bias region may have a length greater than or substantially equal to a length of the hemi-cylindrical nanowire.

In one example embodiment, the gate electrode may cover top and lateral surfaces of the hemi-cylindrical nanowire.

In one example embodiment, a gate dielectric layer may be interposed between the hemi-cylindrical nanowire and the gate electrode. The buried insulating layer may be thicker than the gate dielectric layer and have a thickness of about 20 nm or less.

In one example embodiment, a gate dielectric layer including a single layer may be interposed between the hemi-cylindrical nanowire and the gate electrode. The gate dielectric layer may be in contact with the hemi-cylindrical nanowire and the gate electrode.

In one example embodiment, a source may be in contact with the hemi-cylindrical nanowire, and a drain may be in contact with the hemi-cylindrical nanowire and spaced apart from the source.

In accordance with another aspect of the inventive concepts, a semiconductor device is provided. The semiconductor device includes a back-bias region on a substrate. A buried insulating layer covers the substrate and the back-bias region. A body is on the buried insulating layer and overlaps the back-bias region. A gate electrode is on the body. A gate dielectric layer is interposed between the body and the gate electrode. The buried insulating layer is of a thickness that is greater than a thickness of the gate dielectric layer.

In one example embodiment, the back-bias region partially overlaps the back-bias region and the back-bias region and drain may be spaced apart in a horizontal direction so that the back-bias region does not overlap the drain. In another example embodiments, the back-bias region is spaced at least 10 nm apart from a contact surface between the drain and the body in a horizontal direction.

In one example embodiment, the back-bias region has a length greater than or substantially equal to a length of the body.

In one example embodiment, the buried insulating layer has a thickness of about 20 nm or less.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
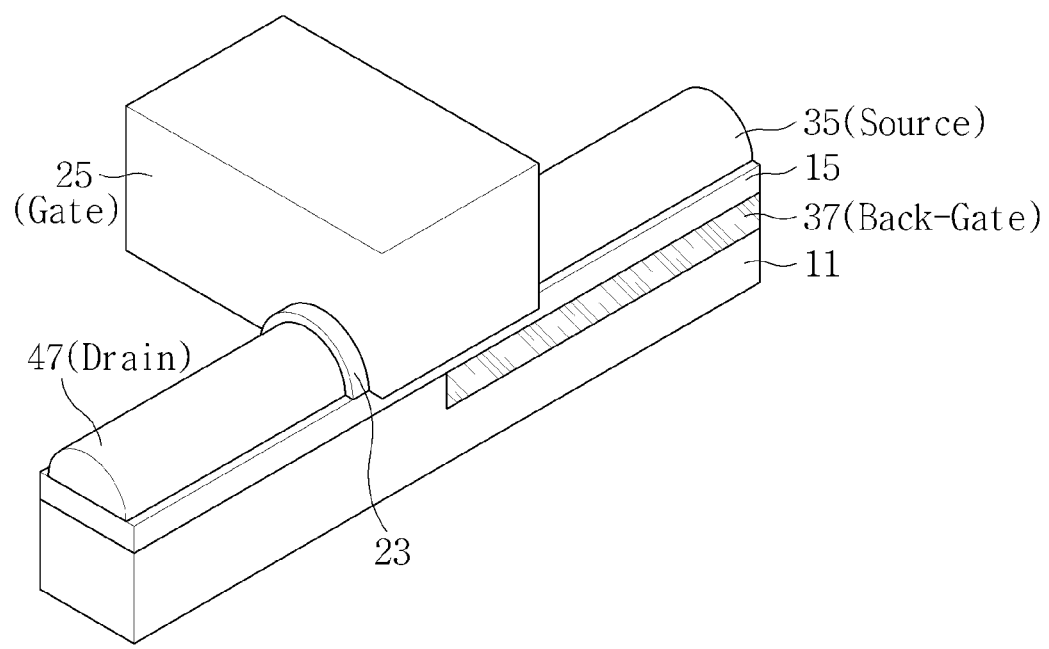
FIGS. 1, 3, 5, 6, 7A, 7B and 7C are perspective views of main components of a semiconductor device according to example embodiments of the inventive concepts.

The various example embodiments will be described more fully with reference to the accompanying drawings, in which example embodiments of the inventive concepts are shown. The inventive concepts may, however, be embodied in many different forms and should not be construed as being limited to the example embodiments set forth herein. It will also be understood that when a layer is referred to as being "on," "connected to" or "coupled to" another element or layer, it can be directly on, connected or coupled to the other element or layer, or intervening elements or layers may also be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed elements.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "top end," "bottom end," "top surface." "bottom surface," "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary charge from implanted to non-implanted region. Likewise, a buried region formed by implantation may result in some implantation in the region between the buried region and the surface through with the implantation takes place. Thus, the regions illustrated in the figures are schematic in nature and their shapes are not intended to illustrate the actual shape of a region of a decide and are not intended to limit the scope of the present inventive concepts.

FIGS. 1, 3, 5, 6, 7A, 7B and 7C are perspective views of main components of a semiconductor device according to example embodiments of the inventive concepts. FIG. 2 is an exploded perspective view illustrating the main components of FIG. 1. FIG. 4 is an exploded perspective view illustrating the main components of FIG. 3. FIGS. 8A, 8B and 8C is an exploded perspective views illustrating the main components of FIGS. 7A, 7B and 7C, respectively. FIGS. 1-8C illustrate, for example, a nanowire device for a conventional CMOS technology.

Figure 2:
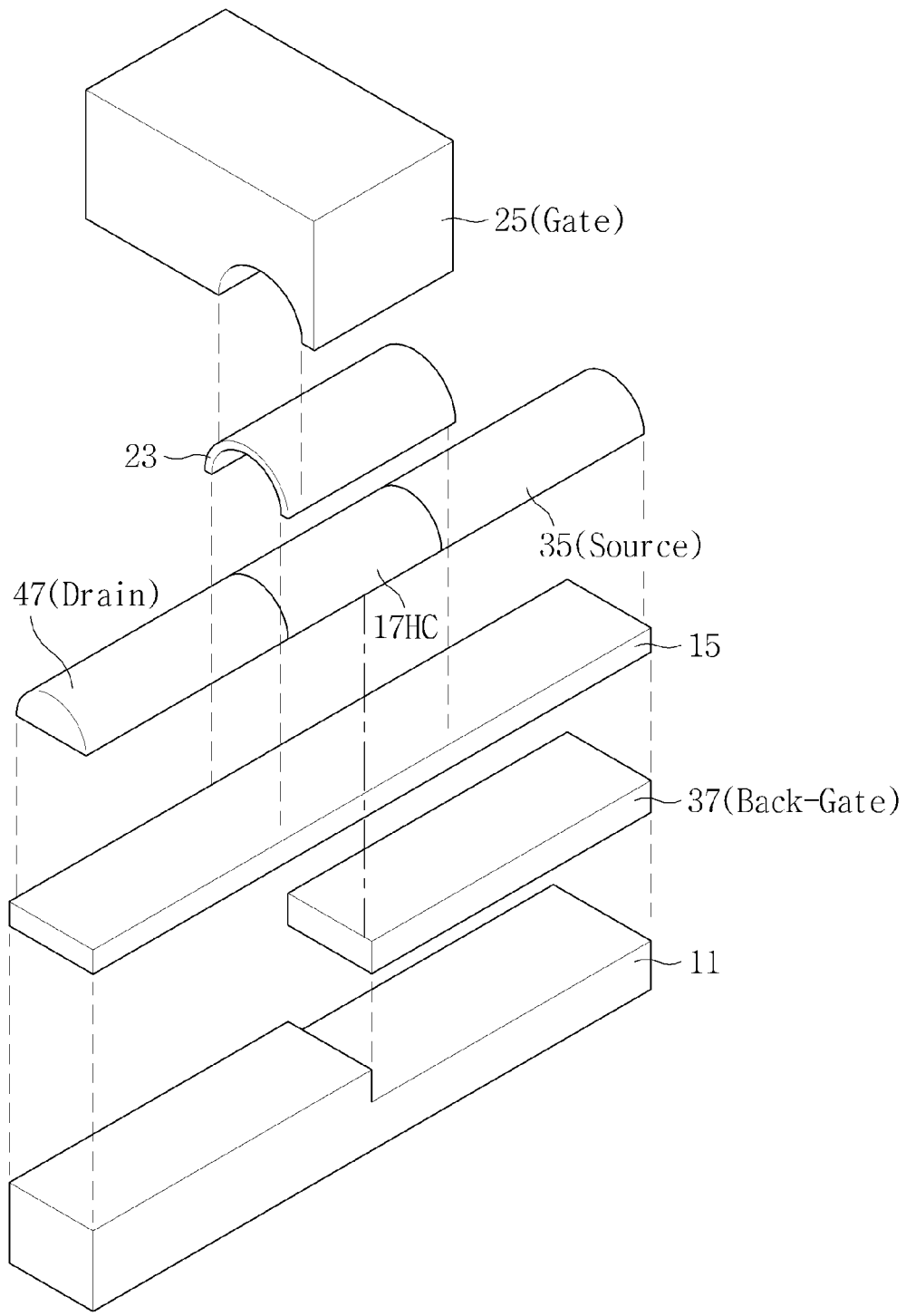
FIG. 2 is an exploded perspective view illustrating the main components of FIG. 1.

Referring to FIGS. 1 and 2, a back-bias region 37 may be disposed on a substrate 11. The back-bias region 37 may be referred to as a back gate. The substrate 11 having the back-bias region 37 may be covered with a buried insulating layer 15. A source 35 and a drain 47 may be disposed on the buried insulating layer 15 and be spaced apart from each other. A body 17HC may be disposed on the buried insulating layer 15 between the source 35 and the drain 47. A gate electrode 25 may be disposed on the body 17HC. A gate dielectric layer 23 may be disposed between the body 17HC and the gate electrode 25.

The back-bias region 37 may partially overlap the body 17HC. The back-bias region 37 may be offset-aligned with the drain 47. That is, the back-bias region 37 may not overlap the drain 47. The back-bias region 37 may overlap the source 35. The length of an overlap region between the back-bias region 37 and the body 17HC may be less than half the length of the body 17HC.

The body 17HC may be a hemi-cylindrical nanowire. A cross-section of the body 17HC may have a semicircular shape. A bottom surface of the body 17HC may have a greater width than a top surface of the body 17HC. The gate electrode 25 may cover top and lateral surfaces of the body 17HC. The buried insulating layer 15 may be thicker than the gate dielectric layer 23 and have a thickness of about 20 nm or less. The gate dielectric layer 23 may be a single layer. Alternatively, the gate dielectric layer 23 may be multiple layers. The gate dielectric layer 23 may be in direct contact with the gate electrode 25 and the body 17HC. The gate dielectric layer 23 may cover top and lateral surfaces of the body 17HC.

The body 17HC may be configured such that an electrical field generated by the back-bias region 37 is uniformly transmitted. Also, since the buried insulation layer 15 is provided as a very thin layer, efficiency of transmission of the electric field generated by the back-bias region 37 to the body 17HC may be maximized. Thus, the semiconductor device according to the example embodiments of the inventive concepts may be provided to easily control a threshold voltage $V_T$. Furthermore, since the back-bias region 37 is offset aligned with the drain 47, an off-state leakage current, such as gate-induced drain leakage (GIDL), may be greatly reduced.

Figure 3:
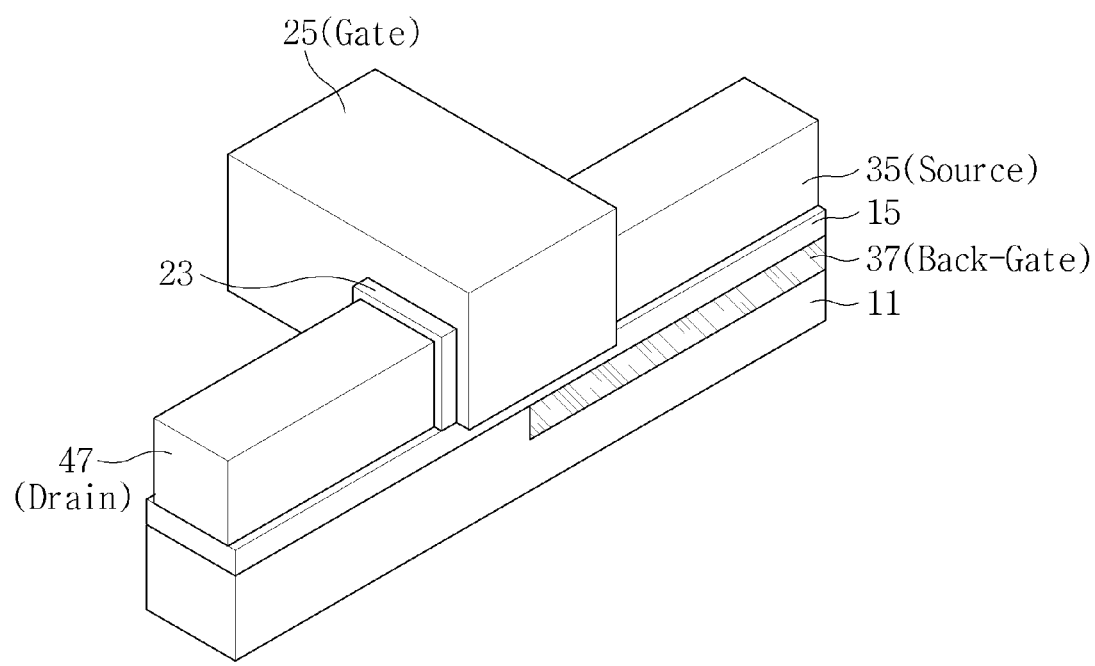
Figure 4:
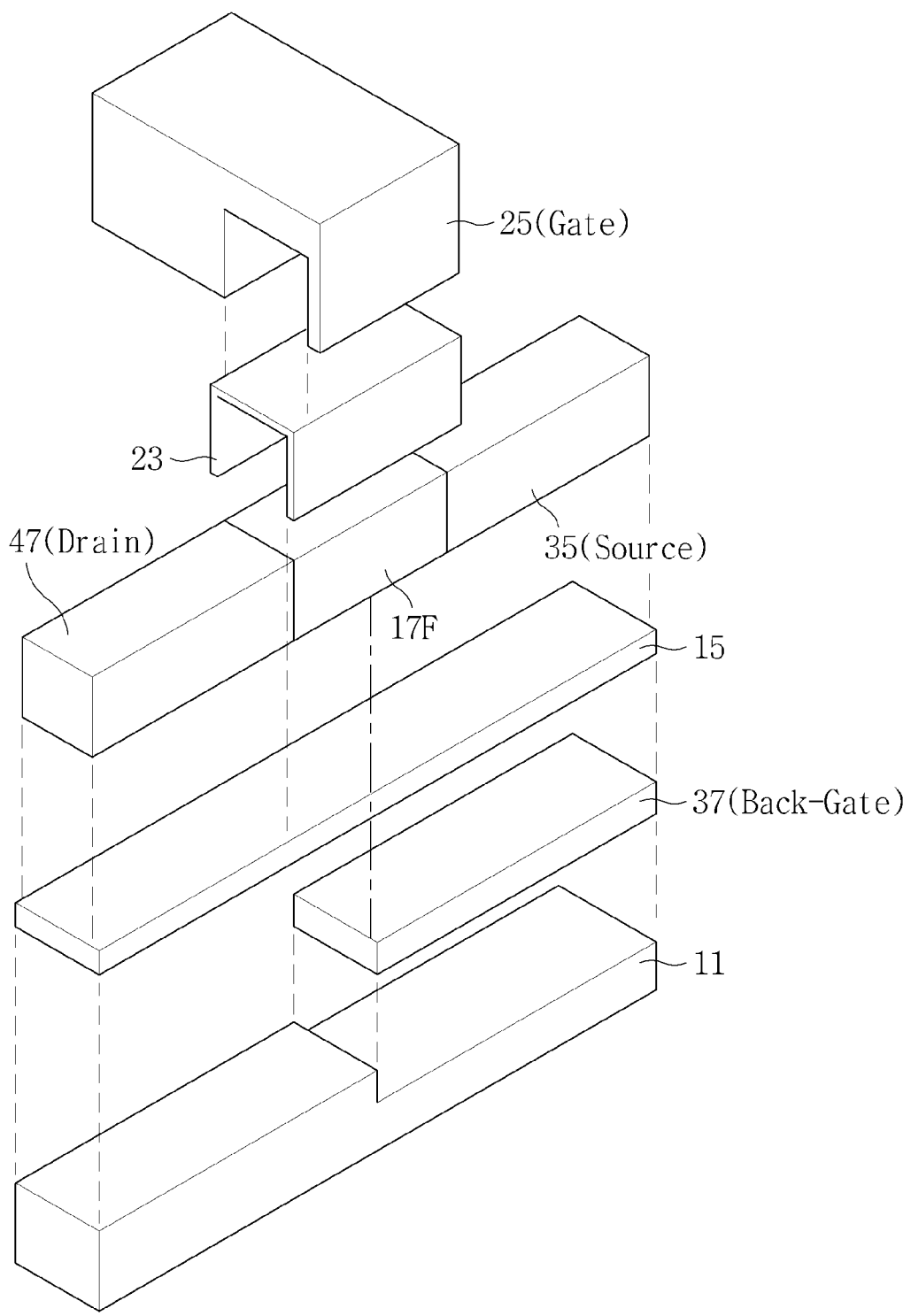
FIG. 4 is an exploded perspective view illustrating the main components of FIG. 3.
Figure 5:
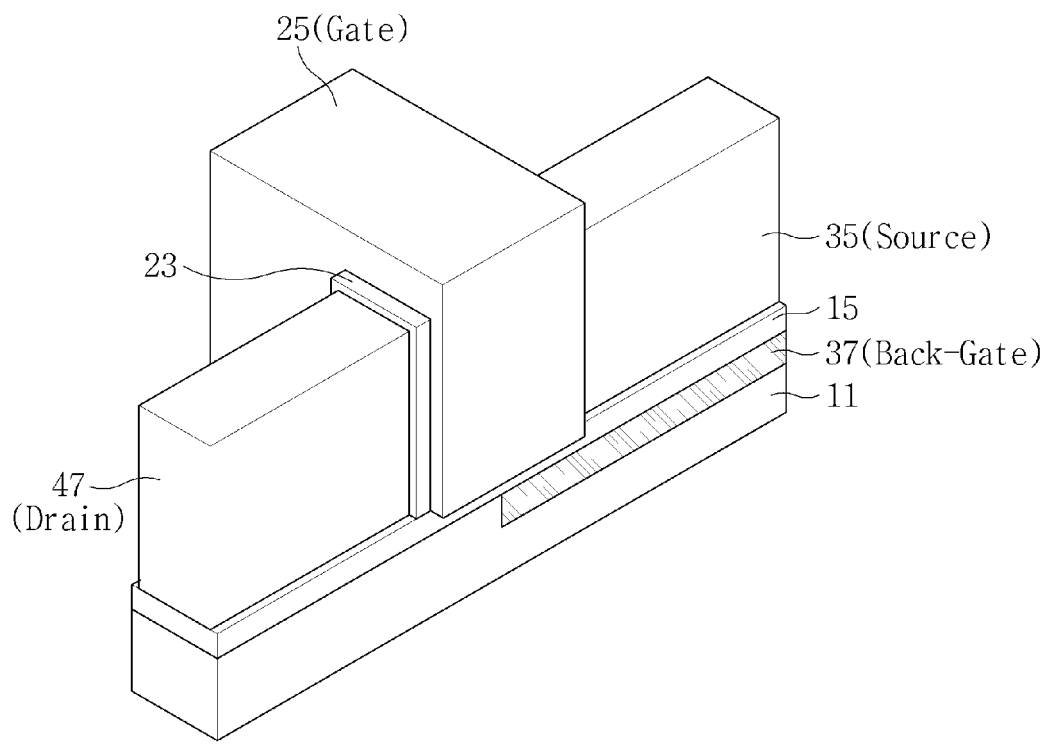
Figure 6:
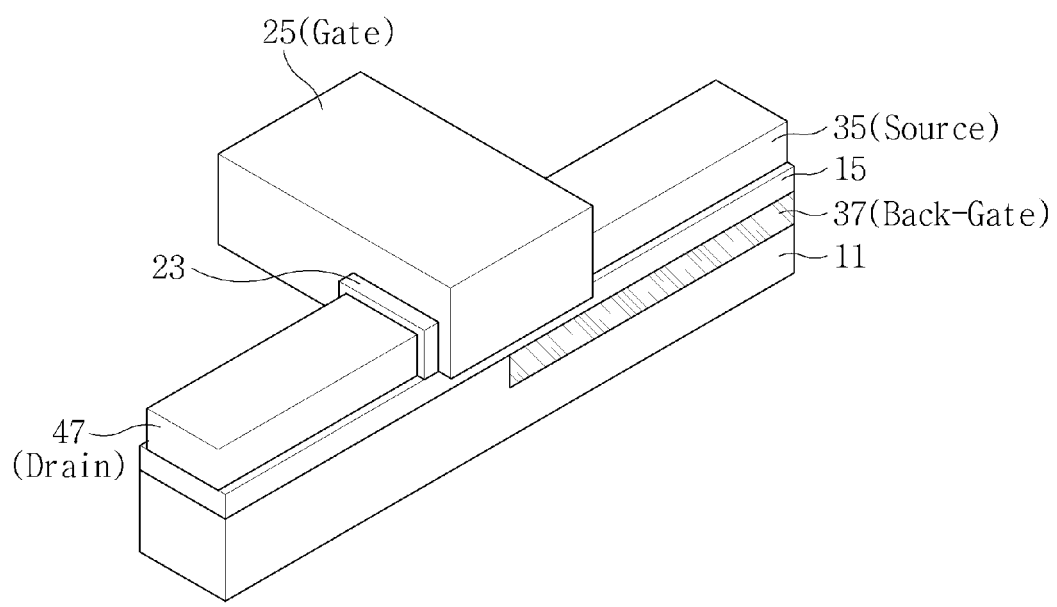

Referring to FIGS. 3, 4, 5, and 6, a back-bias region 37, a buried insulating layer 15, a source 35, a drain 47, a body 17F, a gate dielectric layer 23, and a gate electrode 25 may be formed on a substrate 11. The body 17F may have a fin shape. A cross-section of the body 17F may have a square shape, as illustrated in FIGS. 3 and 4, a rectangular shape having a vertical length greater than a horizontal width thereof, as illustrated in FIG. 5, or a rectangular shape having a vertical length smaller than a horizontal width thereof, as illustrated in FIG. 6. The gate electrode 25 may cover top and lateral surfaces of the body 17F. The back-bias region 37 may partially overlap the body 17F and may be offset-aligned with the drain 47. That is, the back-bias region 37 may not overlap the drain 47. The back-bias region 37 may overlap the source 35. The length of an overlap region between the back-bias region 37 and the body 17F may be less than half the length of the body 17F. The buried insulating layer 15 may be thicker than the gate dielectric layer 23 and have a thickness of about 20 nm or less. The gate dielectric layer 23 may be a single layer. Alternatively, the gate dielectric layer 23 may be multiple layers. The gate dielectric layer 23 may be in direct contact with the gate electrode 25 and the body 17F. The gate dielectric layer 23 may cover top and lateral surfaces of the body 17F.

Figure 7A:
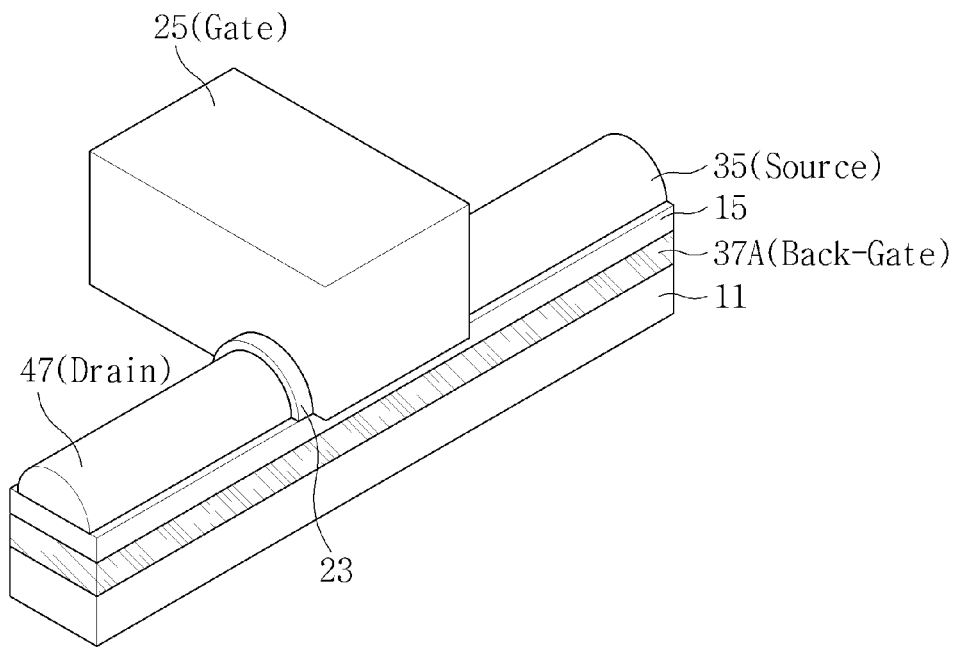
Figure 8A:
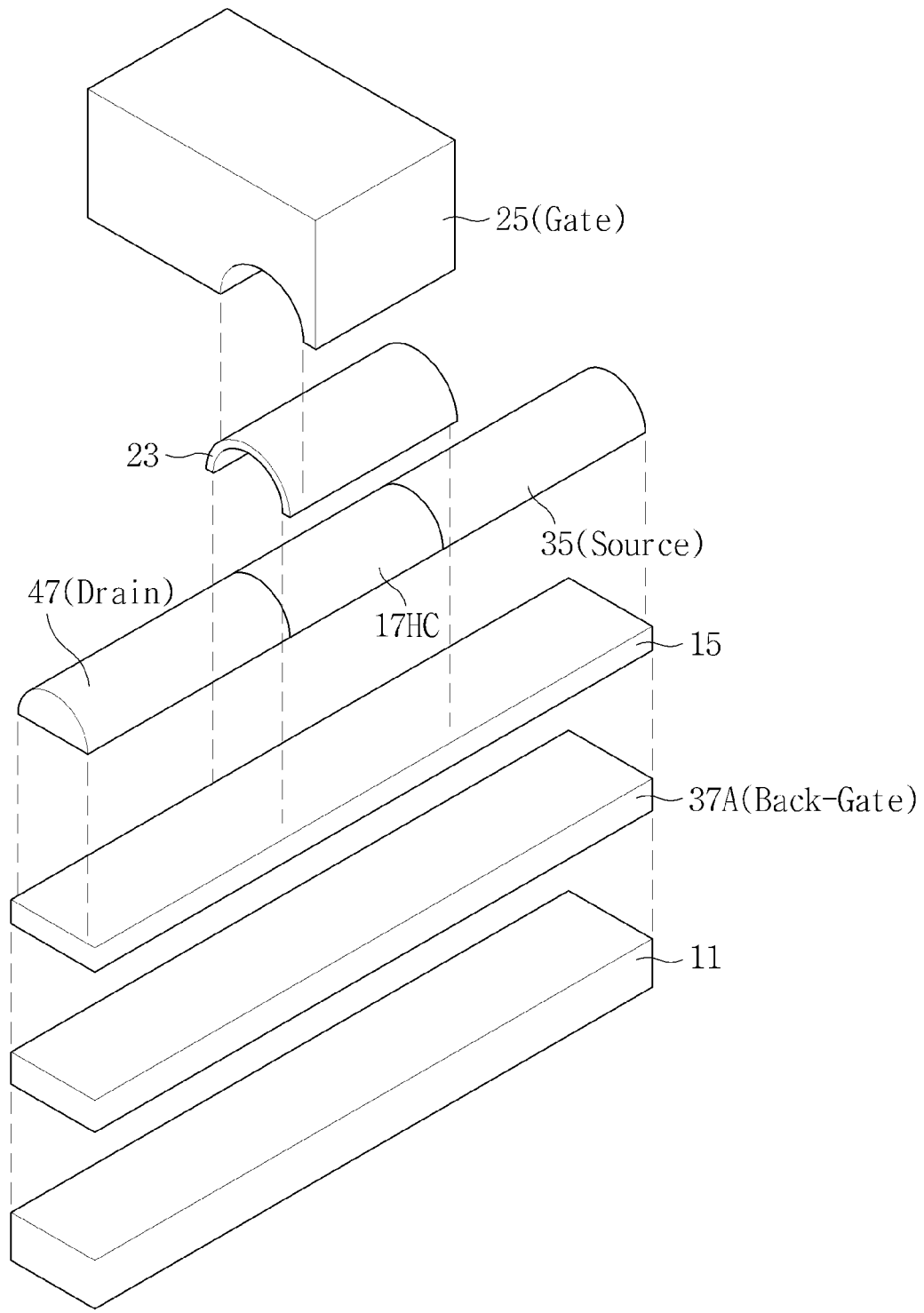
FIGS. 8A, 8B and 8C are exploded perspective views illustrating the main components of FIGS. 7A, 7B and 7C, respectively.
Figure 8B:
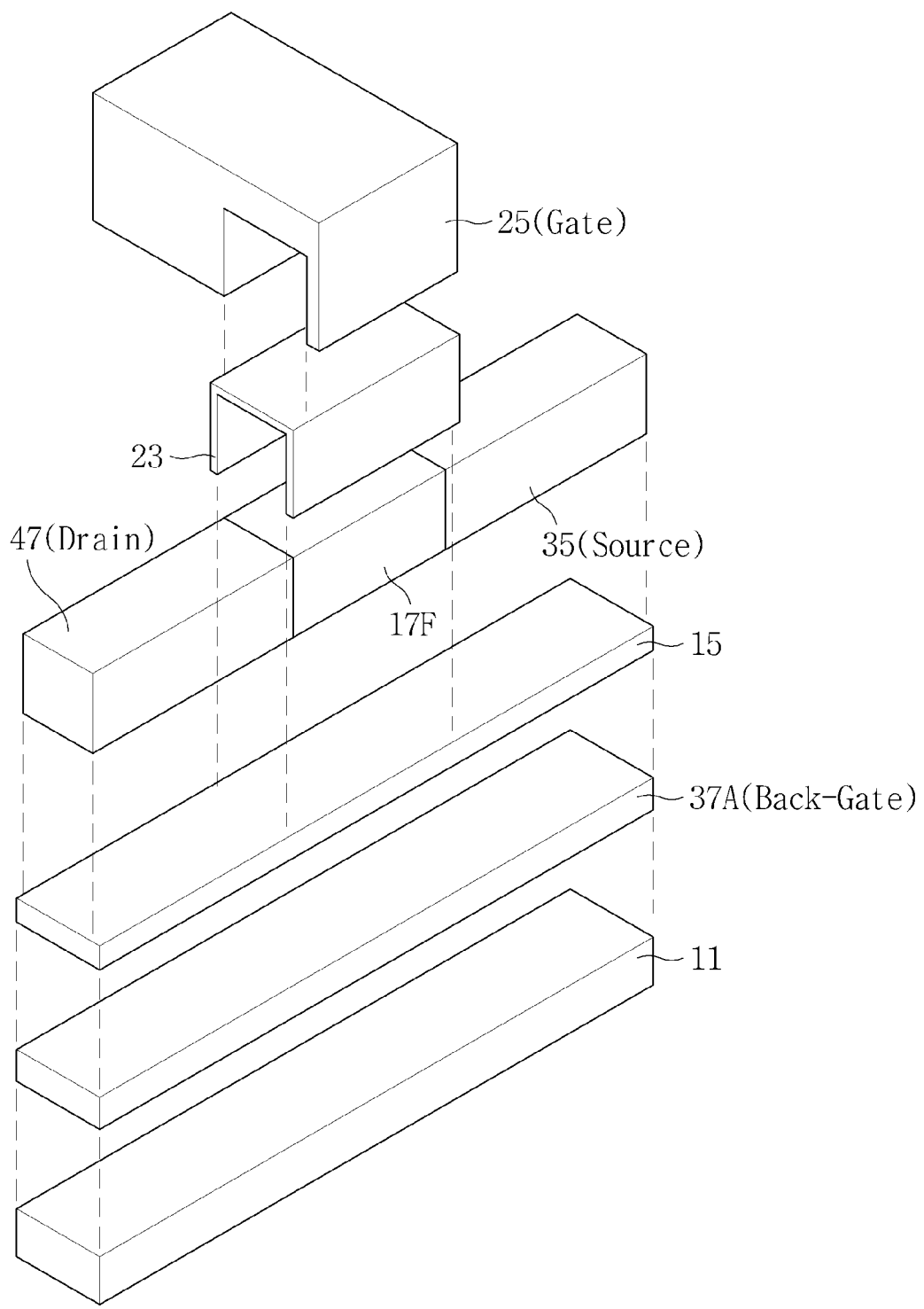
Figure 8C:
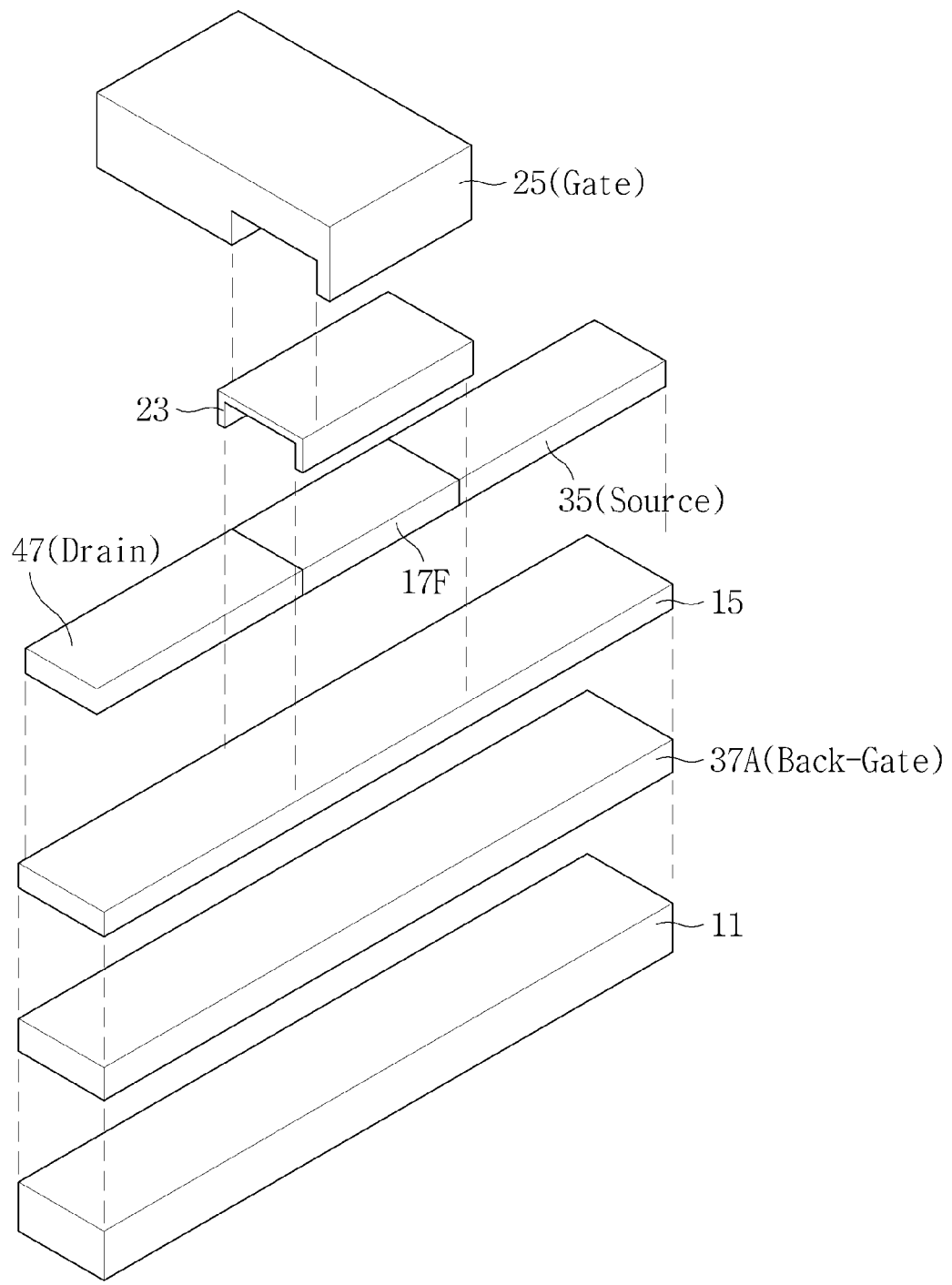

Referring to FIGS. 7A and 8A, a back-bias region 37A, a buried insulating layer 15, a source 35, a drain 47, a body 17HC, a gate dielectric layer 23, and a gate electrode 25 may be formed on a substrate 11. The body 17HC may be a hemi-cylindrical nanowire. A cross-section of the body 17HC may have a semicircular shape. The gate electrode 25 may cover top and lateral surfaces of the body 17HC. The buried insulating layer 15 may be thicker than the gate dielectric layer 23 and have a thickness of about 20 nm or less. The gate dielectric layer 23 may be a single layer. Alternatively, the gate dielectric layer 23 may be multiple layers. The gate dielectric layer 23 may be in direct contact with the gate electrode 25 and the body 17HC. The gate dielectric layer 23 may cover top and lateral surfaces of the body 17HC.

The body 17HC may wholly overlap the back-bias region 37A. The back-bias region 37A may have a greater length than or the same length as the body 17HC. The back-bias region 37A may overlap the drain 47 and the source 35.

Figure 7B:
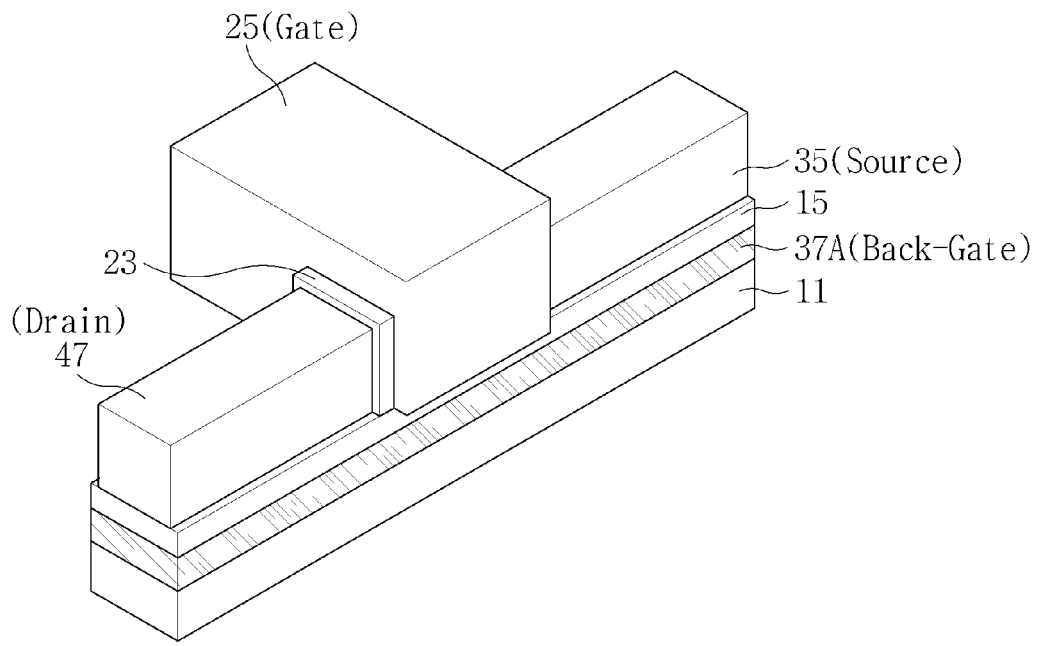
Figure 7C:
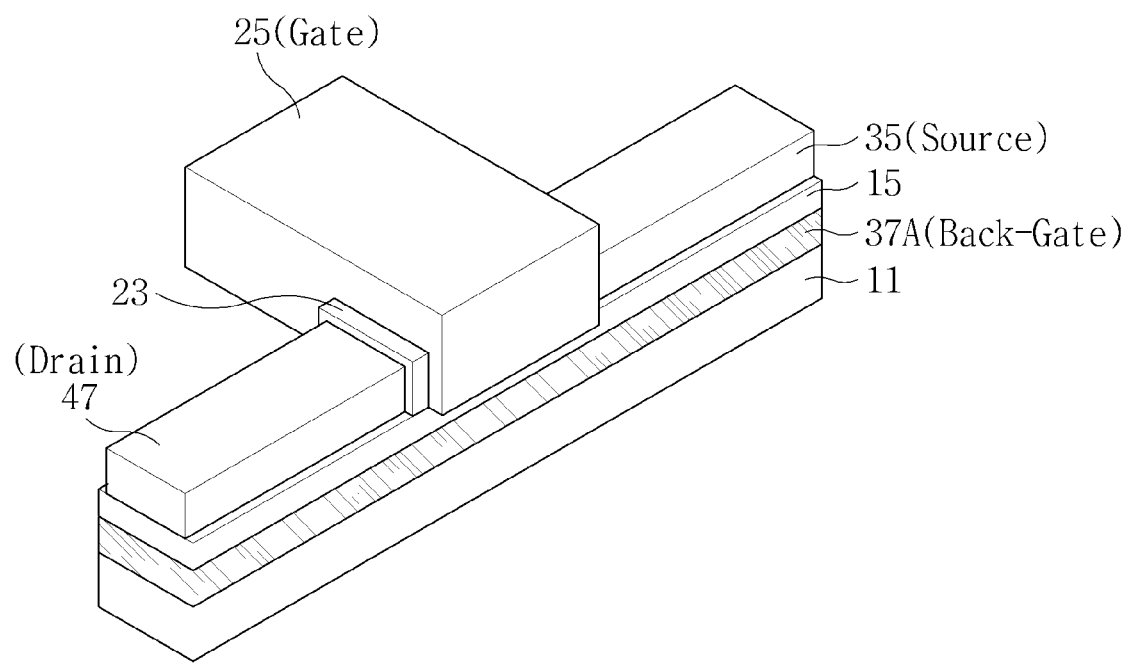

Referring to FIGS. 7B, 7C, 8B and 8C, a back-bias region 37A, a buried insulating layer 15, a source 35, a drain 47, a body 17F, a gate dielectric layer 23, and a gate electrode 25 may be formed on a substrate 11. The body 17F may have a fin shape. A cross-section of the body 17F may have a square shape, as illustrated in FIGS. 7B and 8B, a rectangular shape having a vertical length smaller than a horizontal width thereof, as illustrated in FIGS. 7C and 8C. The gate electrode 25 may cover top and lateral surfaces of the body 17F. The buried insulating layer 15 may be thicker than the gate dielectric layer 23 and have a thickness of about 20 nm or less. The gate dielectric layer 23 may be a single layer. Alternatively, the gate dielectric layer 23 may be multiple layers. The gate dielectric layer 23 may be in direct contact with the gate electrode 25 and the body 17F. The gate dielectric layer 23 may cover top and lateral surfaces of the body 17F.

The body 17F may wholly overlap the back-bias region 37A. The back-bias region 37A may have a greater length than or the same length as the body 17F. The back-bias region 37A may overlap the drain 47 and the source 35.

Figure 9:
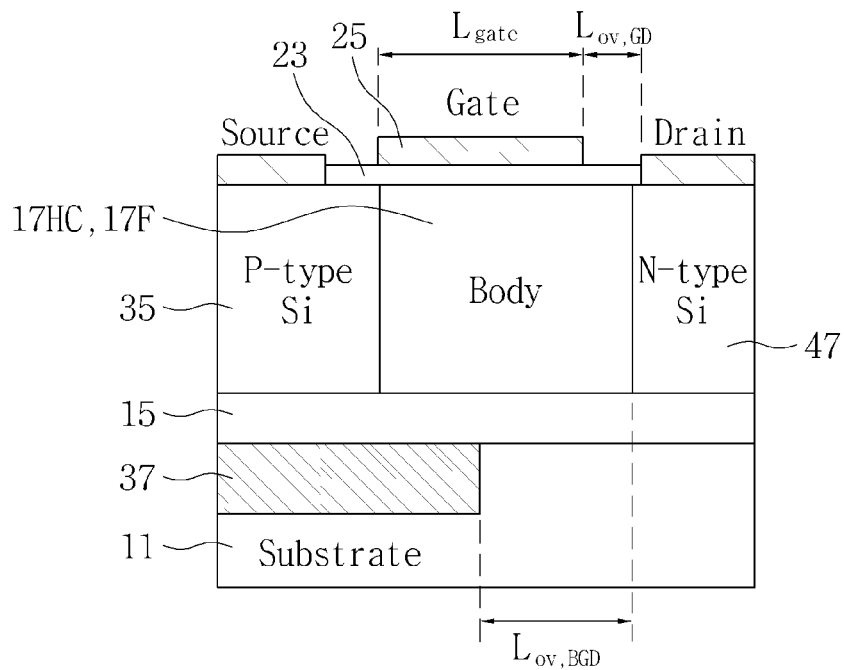
FIGS. 9 and 10 are cross-sectional views of a semiconductor device according to experimental example embodiments of the inventive concepts.
Figure 10:
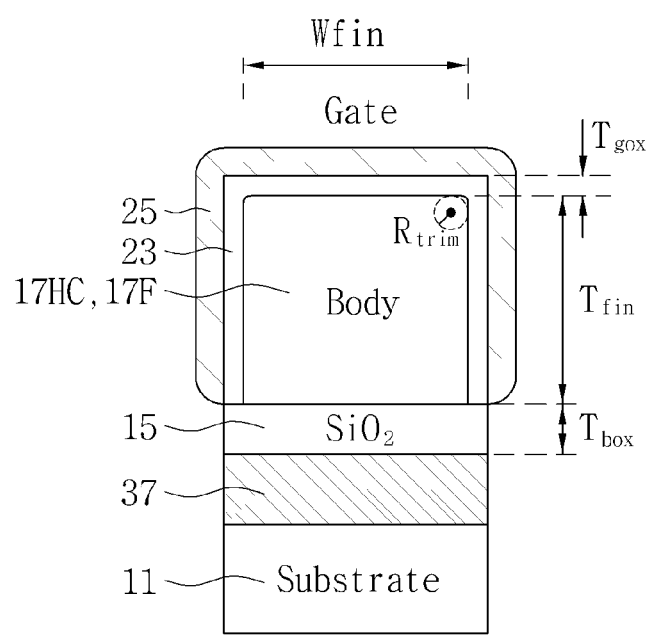

FIGS. 9 and 10 are cross-sectional views of a semiconductor device according to experimental example embodiments of the inventive concepts. The semiconductor devices described with reference to FIGS. 1 through 8C may have similar constructions to that of FIGS. 9 and 10. FIG. 10 is a cross-sectional view taken in a different direction from FIG. 9. For example, the cross-sectional view of FIG. 9 may be taken along a major axis of the body 17HC and 17F, and the cross-sectional views of FIGS. 9 and 10 may be taken in perpendicular directions to each other. FIGS. 11 through 14 are graphs showing drain current relative to gate bias in semiconductor devices according to experimental examples of the inventive concepts.

Referring to FIGS. 9 and 10, the semiconductor device applied to the experimental examples of the inventive concept may include a back-bias region 37, a buried insulating layer 15, a source 35, a drain 47, a body 17HC or 17F, a gate dielectric layer 23, and a gate electrode 25 disposed on a substrate 11. Also, design parameters applied to the experimental examples of the inventive concepts are as shown in Table 1. In Table 1, $L_{gate}$ is a length of the gate electrode 25, $T_{gox}$ is a thickness of the gate dielectric layer 23, $T_{fin}$ is a thickness of the body 17F, $W_{fin}$ is the width of body 17F, $T_{box}$ is the thickness of buried insulating layer 15, $L_{OV,GD}$ is an offset distance between the gate electrode 25 and the drain 47, $L_{OV,BGD}$ is an offset distance between the back-bias region 37 and the drain 47, $R_{trim}$ is a radius of the trim of the body 17HC or 17F, $N_{A,source}$ is a dopant concentration of the source, $N_{D,body}$ is a dopant concentration of the body and $N_{D,drain}$ is a dopant concentration of the drain.

TABLE 1

| [Design parameters] | |
| --- | --- |
| Parameter | Value |
| $L_{gate}$ [nm] | 20 |
| $T_{gox}$ [nm] | 2 |
| $T_{fin}$ [nm] | 10 vs. 20 |
| $W_{fin}$ [nm] | 22 |
| $T_{box}$ [nm] | 5 |
| $L_{ov,GD}$ [nm] | 5 |
| $L_{ov,BGD}$ [nm] | 0 vs. 15 |
| $R_{trim}$ [nm] | 1 vs. 10 |
| $N_{A,source}$ [cm$^{-3}$] | $1.0 \times 10^{20}$ |
| $N_{D,body}$ [cm$^{-3}$] | $1.0 \times 10^{15}$ |
| $N_{D,drain}$ [cm$^{-3}$] | $1.0 \times 10^{18}$ |

In FIGS. 11 through 14, an abscissa denotes a gate bias and is graduated in volts (V), and an ordinate denotes a drain current and is graduated in arbitrary units (a.u.).

Figure 11:
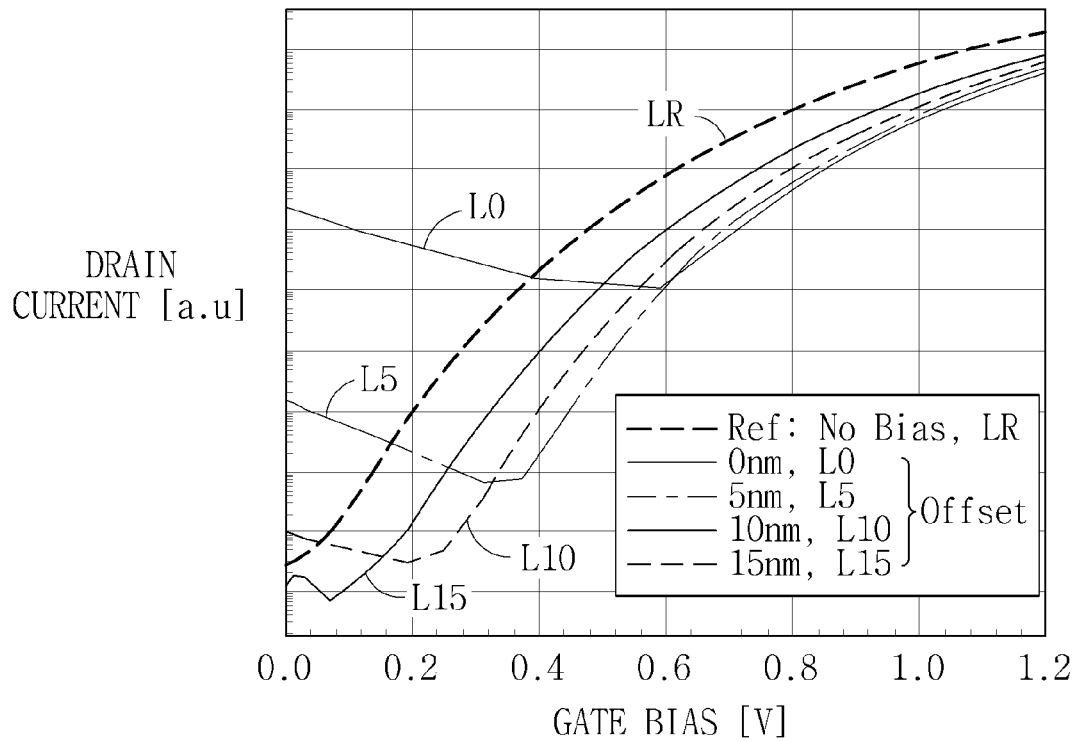
FIGS. 11 through 14 are graphs illustrating a drain current relative to a gate bias in semiconductor devices according to experimental example embodiments of the inventive concepts.

Referring to FIG. 11, when the design parameter $R_{trim}$ of Table 1 is 10, a semiconductor device having characteristics shown in FIG. 11 may be interpreted as a semiconductor device including a body 17HC, which has a similar construction to that of FIGS. 1 and 2. That is, the body 17HC may be a hemi-cylindrical nanowire. Here, the offset distance between the back-bias region 37 and the drain 47 may be indicated by $L_{OV,BGD}$. Curve LR shows a drain current obtained when no power was applied to the back-bias region 37. Curve L0 shows a drain current obtained when a voltage of about −3.3 V was applied to the back-bias region 37 and the offset distance $L_{OV,BGD}$ between the back-bias region 37 and the drain 47 was about 0. Curve L5 shows a drain current obtained when a voltage of about −3.3 V was applied to the back-bias region 37 and the offset distance $L_{OV,BGD}$ between the back-bias region 37 and the drain 47 was about 5 nm. Curve $L_{OV,BGD}$ shows a drain current obtained when a voltage of about −3.3 V was applied to the back-bias region 37 and $L_{OV,BGD}$ was about 10 nm. Curve L15 shows a drain current obtained when a voltage of about −3.3 V was applied to the back-bias region 37 and the offset distance $L_{OV,BGD}$ between the back-bias region 37 and the drain 47 was about 15 nm. As shown in Curves L5, L10, and L15, it can be seen that as the offset distance between the back-bias region 37 and the drain 47 increases, an off-state leakage current greatly decreases. Furthermore, as shown in Curves L10 and L15, when the offset distance between the back-bias region 37 and the drain 47 is about 10 nm or more, an off-state leakage current may be further decreased.

Figure 12:
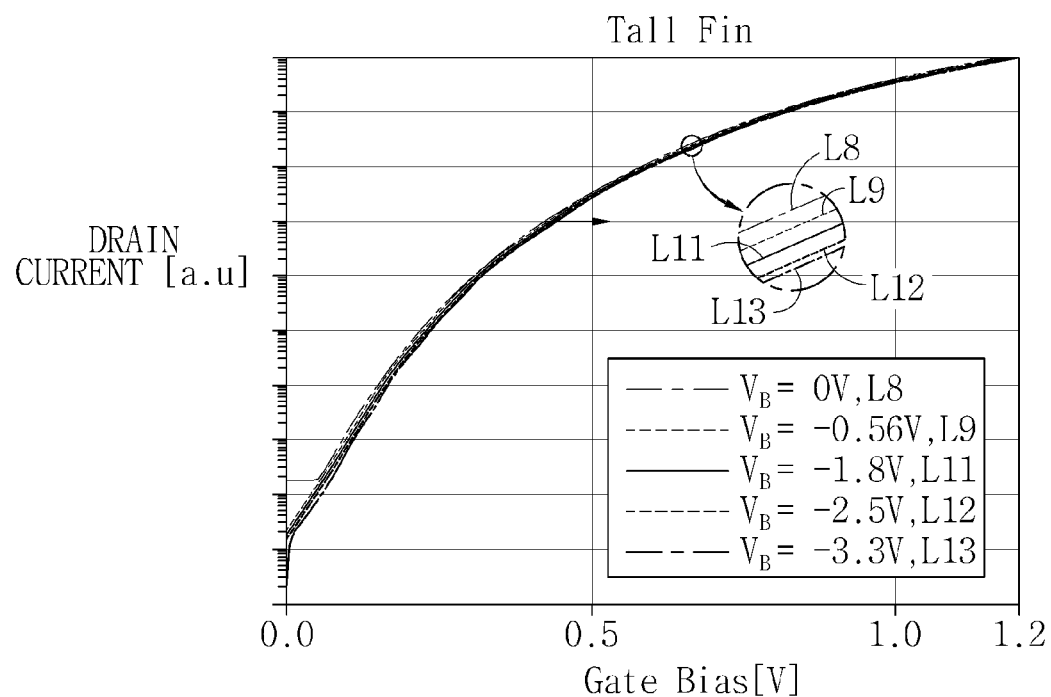

Referring to FIG. 12, when the design parameters $R_{trim}$ and $T_{fin}$ of Table 1 are 1 and 20, respectively, a semiconductor device having characteristics shown in FIG. 12 may be interpreted as a semiconductor device including a body 17F, which has a similar construction to that of FIGS. 3 and 4. That is, the body 17F may have a fin shape. Here, the back-bias region 37A was designed to wholly overlap the body 17F in a similar manner to FIGS. 7B and 8B. In FIG. 12, curve L8 shows a drain current obtained when 0 V was applied to the back-bias region 37A. Curve L9 shows a drain current obtained when a voltage of about 0.56 V was applied to the back-bias region 37. Curve L11 shows a drain current obtained when a voltage of about −1.8 V was applied to the back-bias region 37. Curve L12 shows a drain current obtained when a voltage of about −2.5 V was applied to the back-bias region 37. Curve L13 shows a drain current obtained when a voltage of about −3.3 V was applied to the back-bias region 37.

Figure 13:
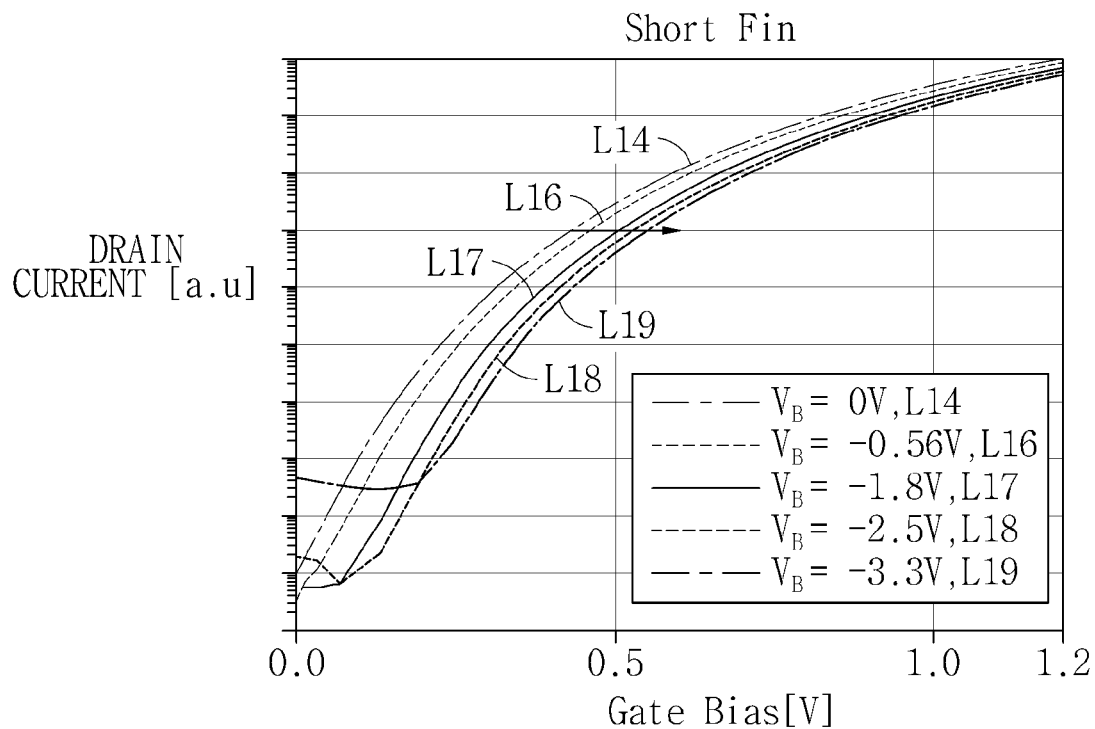

Referring to FIG. 13, when the design parameters $R_{trim}$ and $T_{fin}$ of Table 1 are 1 and 10, respectively, a semiconductor device having characteristics shown in FIG. 13 may be interpreted as a semiconductor device including a body 17F, which has a similar construction to that of FIG. 6. Here, the back-bias region 37A was designed to wholly overlap the body 17F in a similar manner to FIGS. 7C and 8C. In FIG. 13, curve L14 shows a drain current obtained when no power was applied to the back-bias region 37A. Curve L16 shows a drain current obtained when a voltage of about −0.56 V was applied to the back-bias region 37A. Curve L17 shows a drain current obtained when a voltage of about −1.8 V was applied to the back-bias region 37A. Curve L18 shows a drain current obtained when a voltage of about −2.5 V was applied to the back-bias region 37A. Curve L19 shows a drain current obtained when a voltage of about −3.3 V was applied to the back-bias region 37A.

Figure 14:
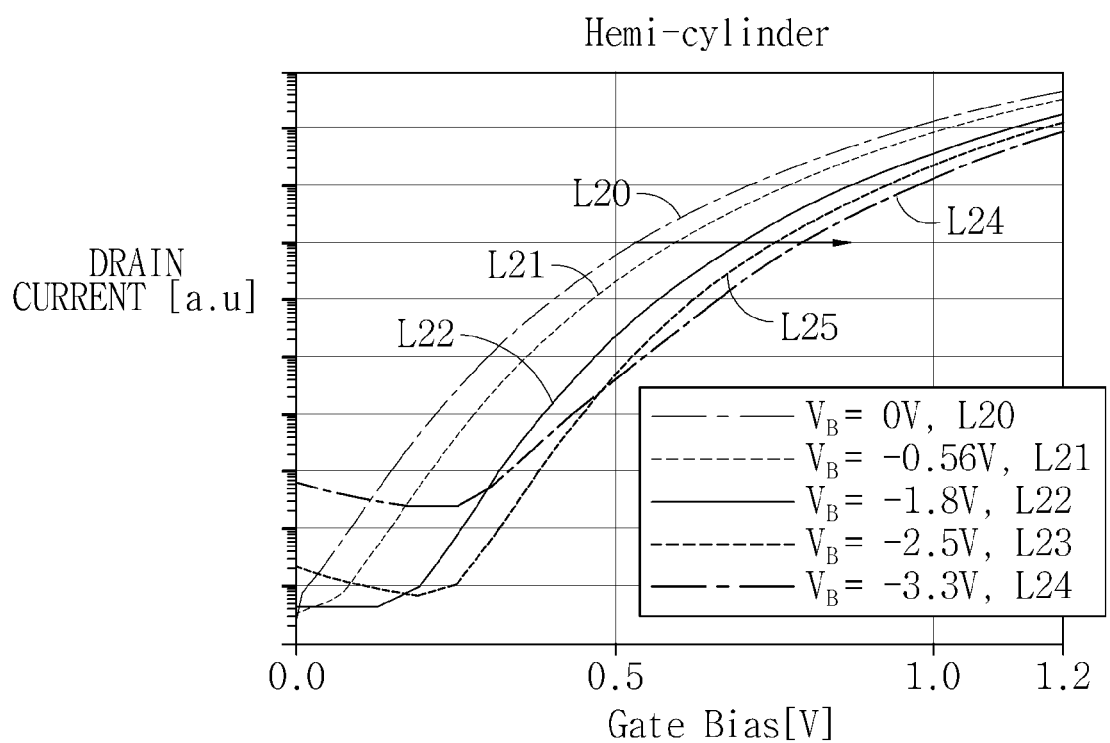

Referring to FIG. 14, when the design parameter $R_{trim}$ of Table 1 is 10, a semiconductor device having characteristics shown in FIG. 14 may be interpreted as a semiconductor device including a body 17HC, which has a similar construction to that of FIGS. 7A and 8A. That is, the body 17HC may be a hemi-cylindrical nanowire. Here, the back-bias region 37 was designed to wholly overlap the body 17HC in a similar manner to FIGS. 7A and 8A. Curve L20 shows a drain current obtained when no power was applied to the back-bias region 37. Curve L21 shows a drain current obtained when a voltage of about −0.56 V was applied to the back-bias region 37. Curve L22 shows a drain current obtained when a voltage of about −1.8 was applied to the back-bias region 37. Curve L23 shows a drain current obtained when a voltage of about −2.5 V was applied to the back-bias region 37. Curve L24 shows a drain current obtained when a voltage of about −3.3 V was applied to the back-bias region 37.

Referring to FIGS. 12 through 14, it can be seen that when the body 17HC is a hemi-cylindrical nanowire, a variation in drain current corresponding to a bias applied to the back-bias region 37 may be relatively increased.

FIGS. 15 through 37 are cross-sectional views illustrating a method of fabricating a semiconductor device according to example embodiments of the inventive concepts.

Figure 15:
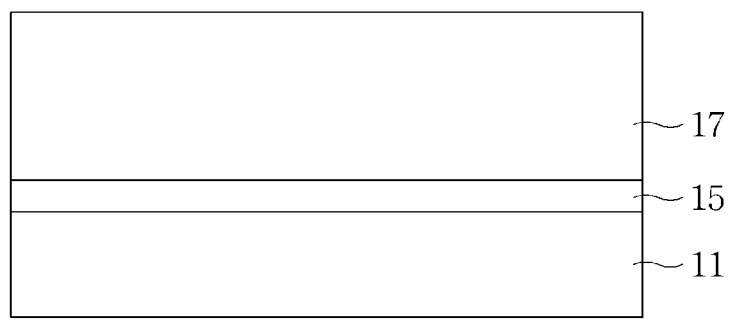
FIGS. 15 through 37 are cross-sectional views illustrating a method of fabricating a semiconductor device according to example embodiments of the inventive concepts.

Referring to FIG. 15, a buried insulating layer 15 and a body layer 17 may be sequentially stacked on a substrate 11. The substrate 11 may be a semiconductor substrate, such as a silicon wafer having P-type impurities. The buried insulating layer 15 may include an insulating layer, such as a silicon oxide layer. The buried insulating layer 15 may have a thickness of about 20 nm or less. The body layer 17 may include a semiconductor layer, such as a single crystalline silicon layer.

Figure 16:
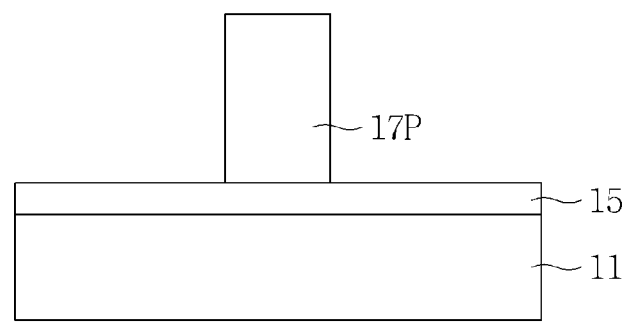

Referring to FIG. 16, the body layer 17 may be patterned to form a body pattern 17P. The buried insulating layer 15 may be exposed at both sides of the body pattern 17P. The body pattern 17P may have a rod shape. The body pattern 17P may assume a rectangular shape from a cross-sectional view. The body pattern 17P may be referred to as a fin.

Figure 17:
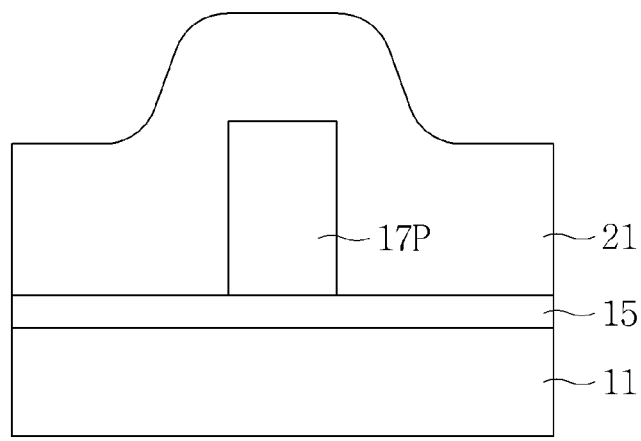

Referring to FIG. 17, a first molding layer 21 may be formed to cover the body pattern 17P. The first molding layer 21 may include a material having an etch selectivity with respect to the buried insulating layer 15 and the body pattern 17P. For example, the first molding layer 21 may include silicon oxide, such as a medium-temperature oxide (MTO).

Figure 18:
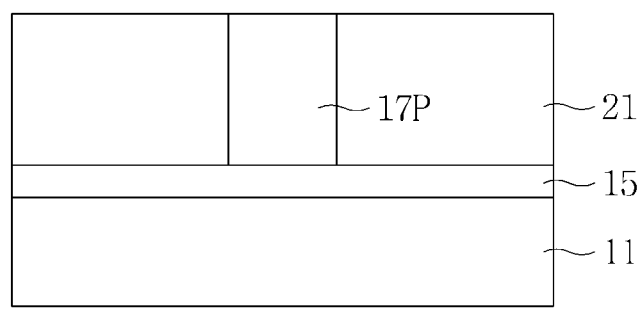

Referring to FIG. 18, the first molding layer 21 may be planarized to expose the body pattern 17P. The first molding layer 21 may remain present at both sides of the body pattern 17P. The planarization of the first molding layer 21 may be performed using a chemical mechanical polishing (CMP) process, an etchback process, or a combination thereof.

Figure 19:
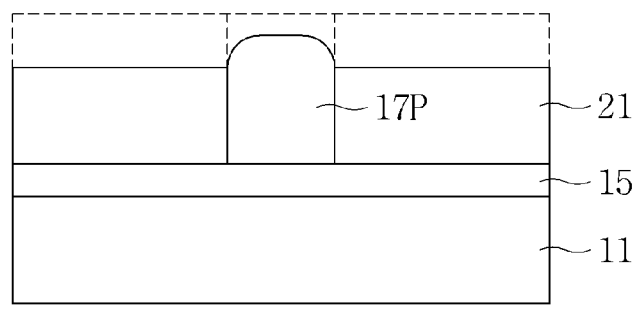
Figure 20:
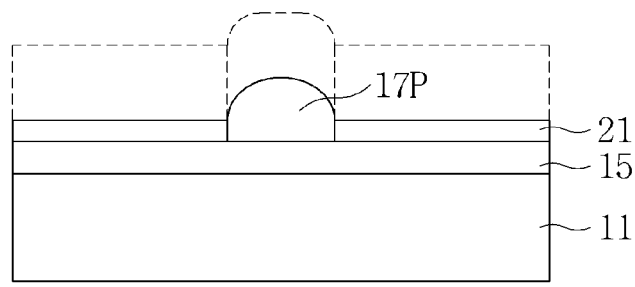
Figure 21:
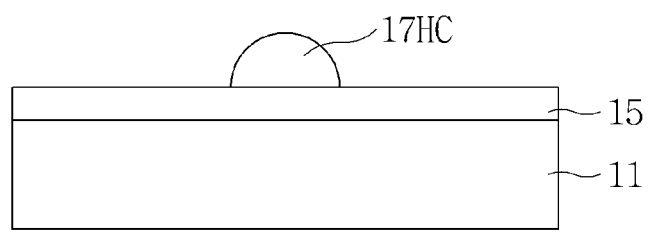

Referring to FIGS. 19 through 21, the first molding layer 21 may be removed using a differential etching process, and the body pattern 17P may be partially etched to form a body 17HC. For example, the differential etching process may be performed using a standard clean-1 (SC-1) process or an ammonia peroxide mixture (APM) process. During the differential etching process, the first molding layer 21 may be etched at a higher rate than the body pattern 17P. Thus, lateral surfaces of the body pattern 17P may be exposed, and corners at which a top surface of the body pattern 17 meets the lateral surfaces thereof may be etched at a relatively high rate. As a result, the body 17HC may be formed of a hemi-cylindrical nanowire. Also, a bottom surface of the body 17HC may be formed to a greater width than the top surface of the body 17HC. The buried insulating layer 15 may be exposed at both sides of the body 17HC.

Figure 22:
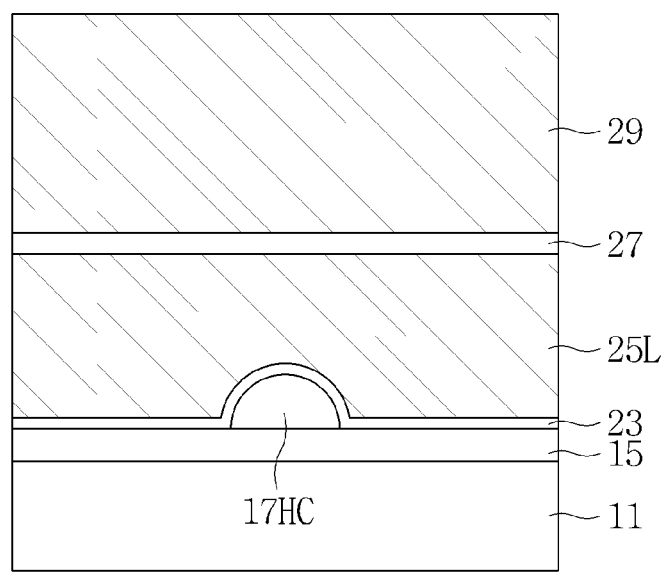
Figure 23:
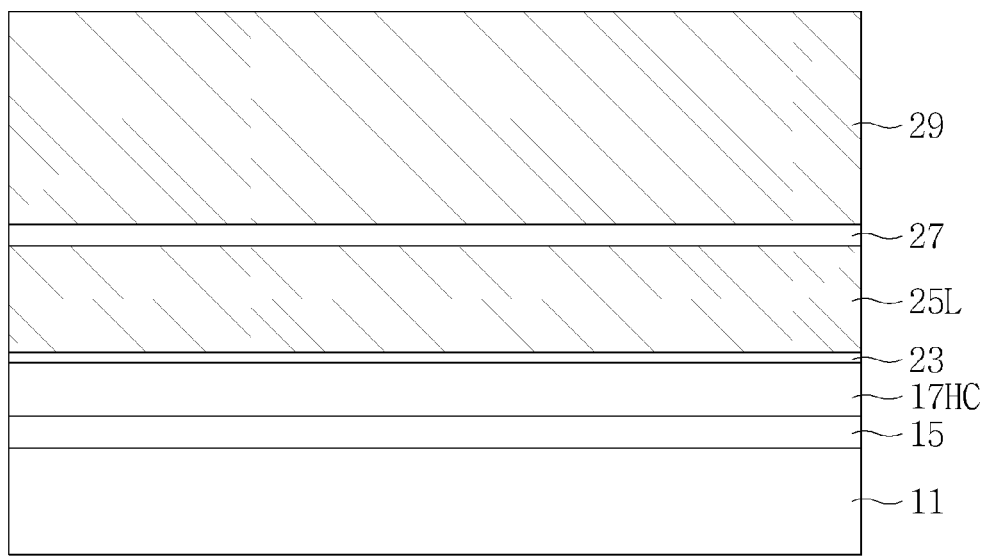

FIG. 23 is a cross-sectional view taken in a different direction from FIG. 22. The cross-sectional view of FIG. 23 may be taken along a major axis of a body 17HC, and the cross-sectional views of FIGS. 22 and 23 may be taken in perpendicular directions to each other.

Referring to FIGS. 22 and 23, a gate dielectric layer 23 may be formed to cover a surface of the body 17HC. The gate dielectric layer 23 may also be stacked on the buried insulating layer 15. A gate layer 25L may be formed on the gate dielectric layer 23. An etch stop layer 27 may be formed on the gate layer 25L. A second molding layer 29 may be formed on the etch stop layer 27.

The gate dielectric layer 23 may include silicon oxide, silicon nitride, silicon oxynitride, a high-k dielectric material, or a combination thereof. In some example embodiments, the gate dielectric layer 23 may be a single layer. In alternative embodiments, the gate dielectric layer 23 may have multiple layers. The gate dielectric layer 23 may be in direct contact with the body 17HC and the gate layer 25L. The gate layer 25L may include a conductive material, such as polysilicon (poly-Si). The etch stop layer 27 may include a material having an etch selectivity with respect to the gate layer 25L and the second molding layer 29. The etch stop layer 27 may include silicon oxide, such as an MTO. The second molding layer 29 may include poly-Si.

Figure 24:
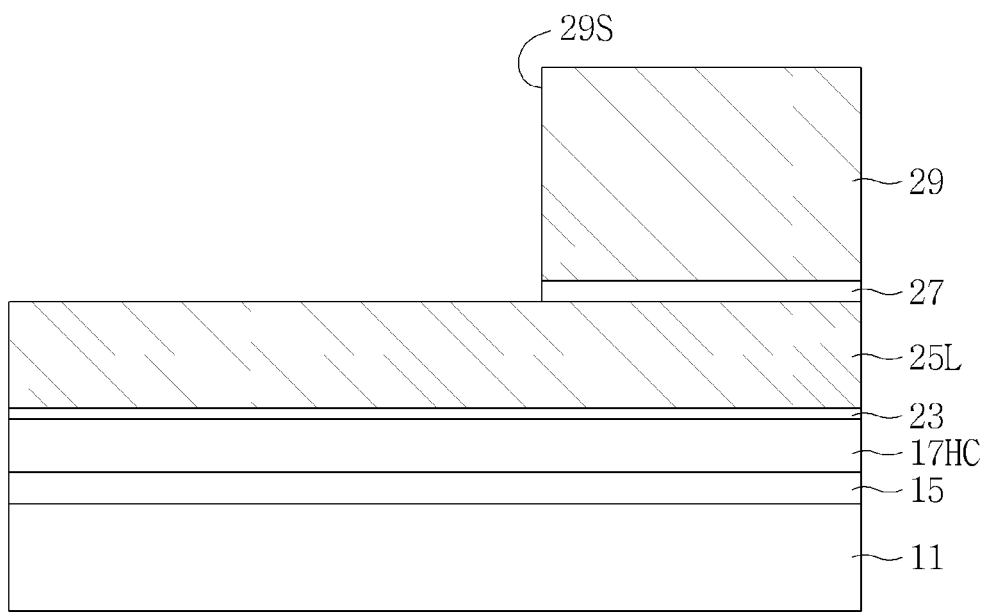

Referring to FIG. 24, the second molding layer 29 and the etch stop layer 27 may be sequentially patterned, thereby partially exposing a top surface of the gate layer 25L. As a result, a first sidewall 29S may be provided on one ends of the second molding layer 29 and the etch stop layer 27.

Figure 25:
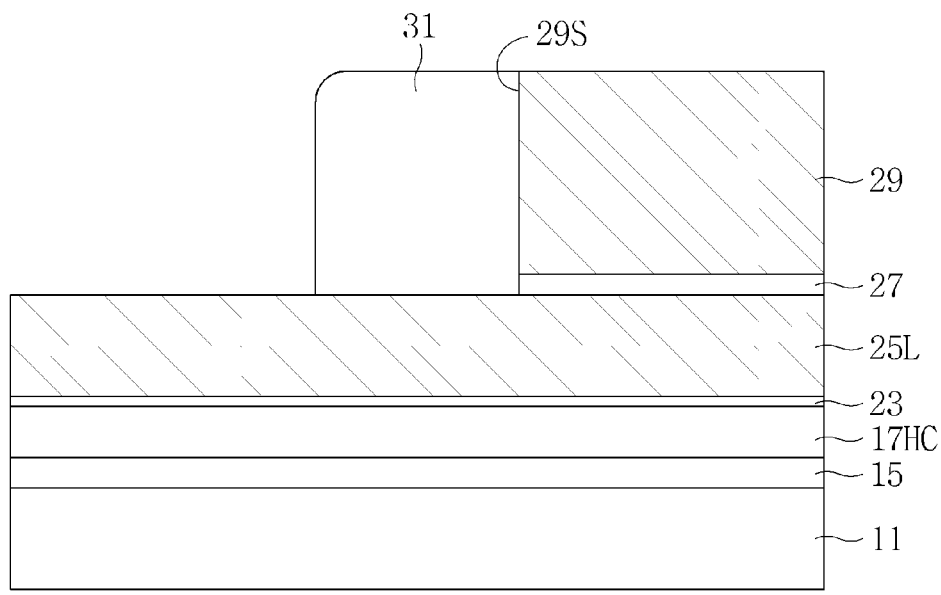

Referring to FIG. 25, a first spacer 31 may be formed on the first sidewall 29S. The first spacer 31 may be formed using a thin-layer forming process and an anisotropic etching process. The first spacer 31 may partially cover the gate layer 25L. The top surface of the gate layer 25L adjacent to the first spacer 31 may be exposed. The first spacer 31 may include silicon oxide, such as an MTO.

Figure 26:
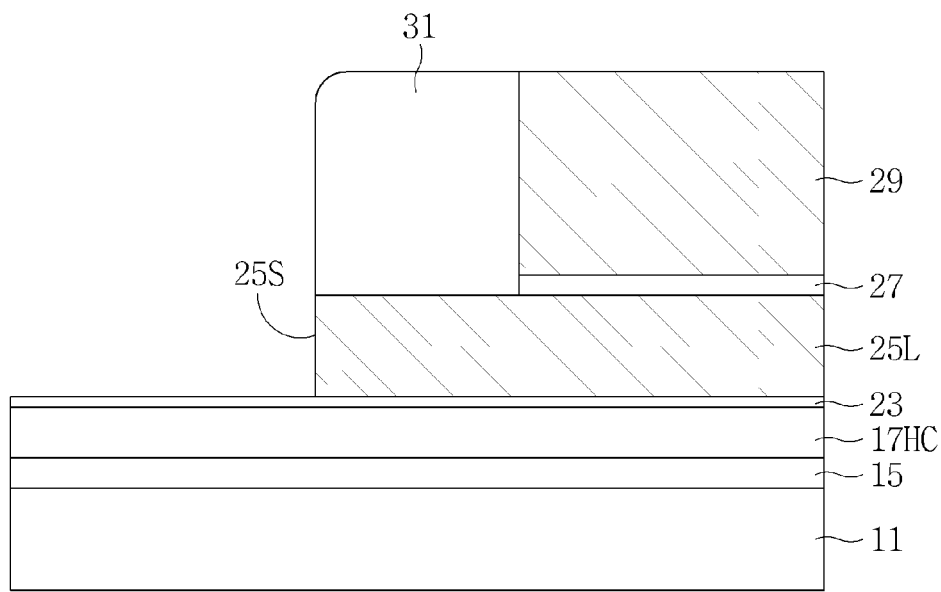

Referring to FIG. 26, the gate layer 25L may be anisotropically etched using the first spacer 31 and the second molding layer 29 as an etch mask, thereby partially exposing the gate dielectric layer 23. The gate layer 25L may remain present under the first spacer 31 and the second molding layer 29. A second sidewall 25S may be provided on one end of the gate layer 25L.

Figure 27:
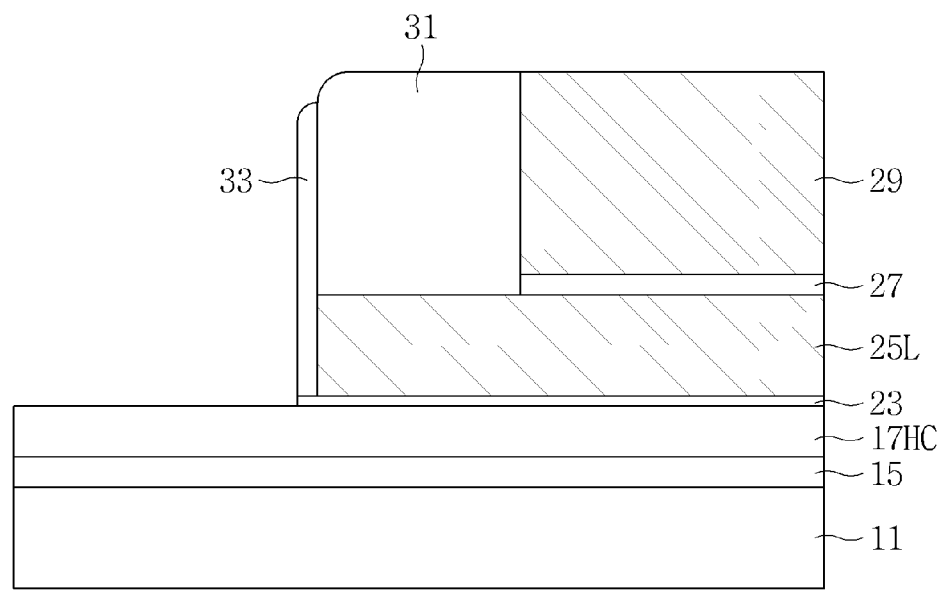

Referring to FIG. 27, a second spacer 33 may be formed on the second sidewall 25S. The second spacer 33 may be formed using a thin-layer forming process and an anisotropic etching process. The second spacer 33 may partially cover the gate dielectric layer 23. The gate dielectric layer 23 may be etched using the first spacer 31, the second molding layer 29 and the second spacer 33 as an etching mask thereby exposing a top surface of the body 17HC adjacent to the second spacer 33. The second spacer 33 may include silicon oxide, silicon nitride, silicon oxynitride, or a combination thereof.

Figure 28:
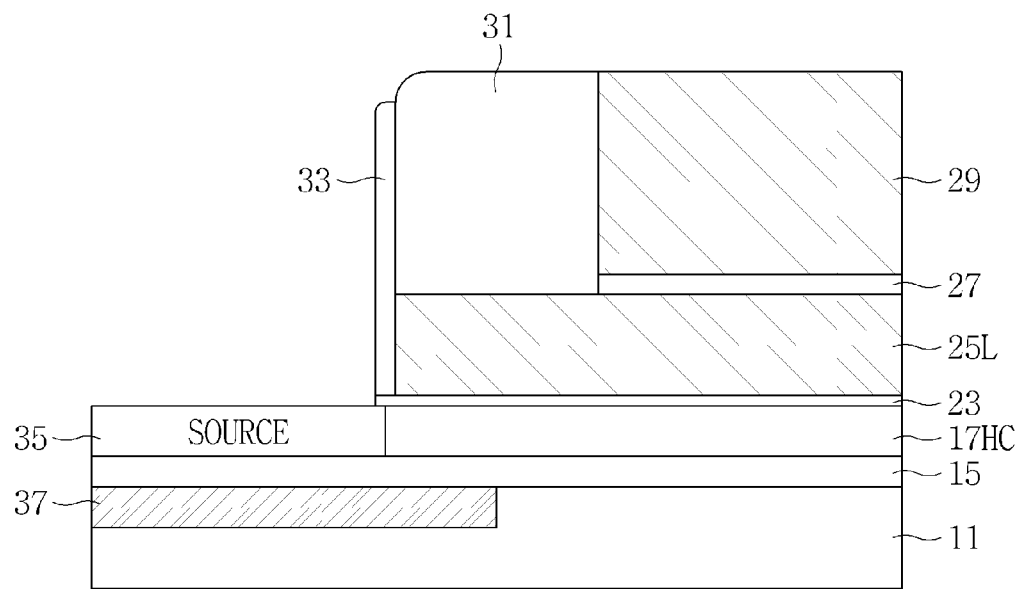
Figure 29:
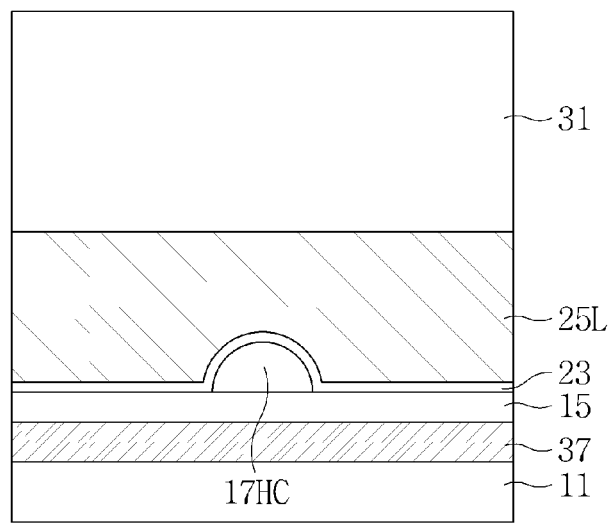

Referring to FIGS. 28 and 29, a back-bias region 37 may be formed in the substrate 11. The back-bias region 37 may partially overlap the body 17HC under the body 17HC. A length of an overlap region between the back-bias region 37 and the body 17HC may be controlled using an oblique ion implantation process. The back-bias region 37 may include impurities of a different conductivity from the substrate 11. For example, the substrate 11 may include P-type impurities, while the back-bias region 37 may include N-type impurities. Alternatively, the substrate may include N-type impurities, while the back-bias region 37 include P-type impurities.

Meanwhile, a source 35 may be formed in the body 17HC using another ion implantation process. The body 17HC may remain present under the gate layer 25L. The body 17HC may include P-type or N-type impurities. The source 35 may include impurities of the same conductivity as the body 17HC. For example, the body 17HC may include P-type impurities, and the source 35 may also include P-type impurities.

In other embodiments, the source 35 may include impurities of a different conductivity from the body 17HC. For example, the body 17HC may include P-type impurities, while the source 35 may include N-type impurities. Alternatively, the body 17HC may include N-type impurities, while the source 35 may include N-type impurities.

Figure 30:
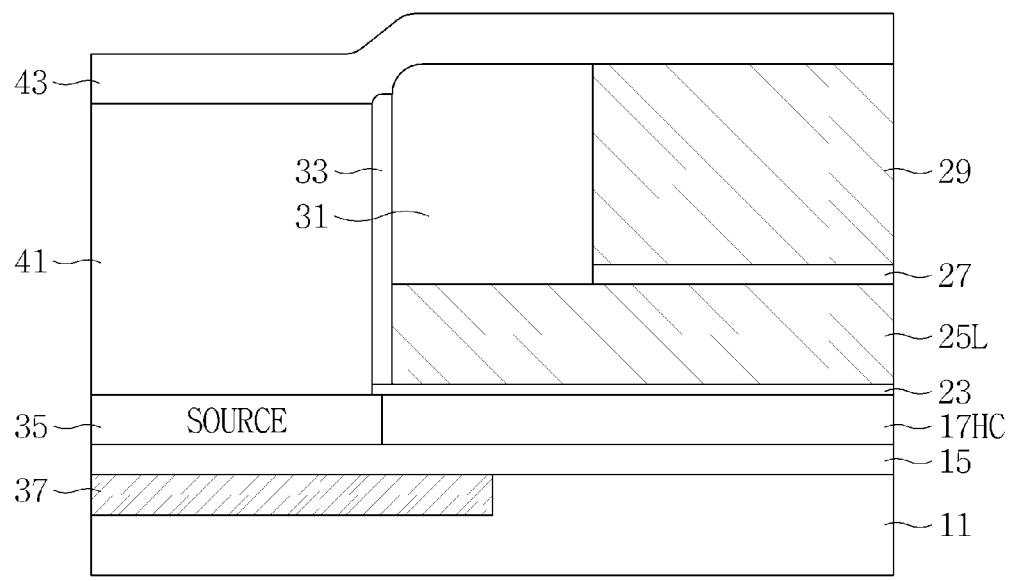

Referring to FIG. 30, a first interlayer insulating layer 41 and a second interlayer insulating layer 43 may be sequentially formed on the source 35. For example, the first interlayer insulating layer 41 may include tetra ethyl orthosilicate (TEOS). The first interlayer insulating layer 41 may fill concave portions on the substrate 11. The first interlayer insulating layer 41 may be formed on the source 35 along the second spacer 33. The second interlayer insulating layer 43 may include high-density plasma oxide. The second interlayer insulating layer 43 may cover the entire top surface of the substrate 11.

Figure 31:
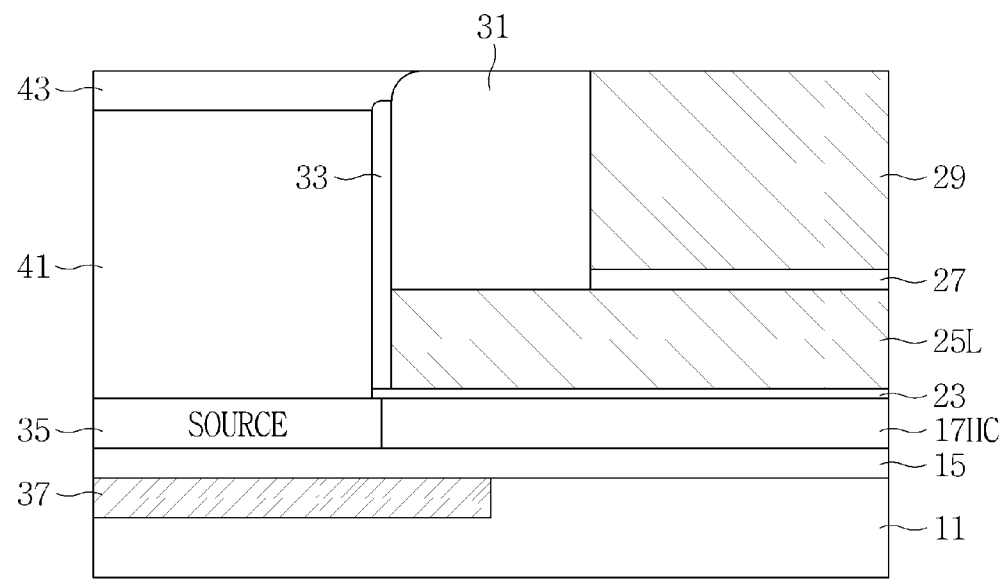

Referring to FIG. 31, the second interlayer insulating layer 43 may be planarized to expose the first spacer 31 and the second molding layer 29. The planarization of the second interlayer insulating layer 43 may be performed using a CMP process, an etchback process, or a combination thereof.

Figure 32:
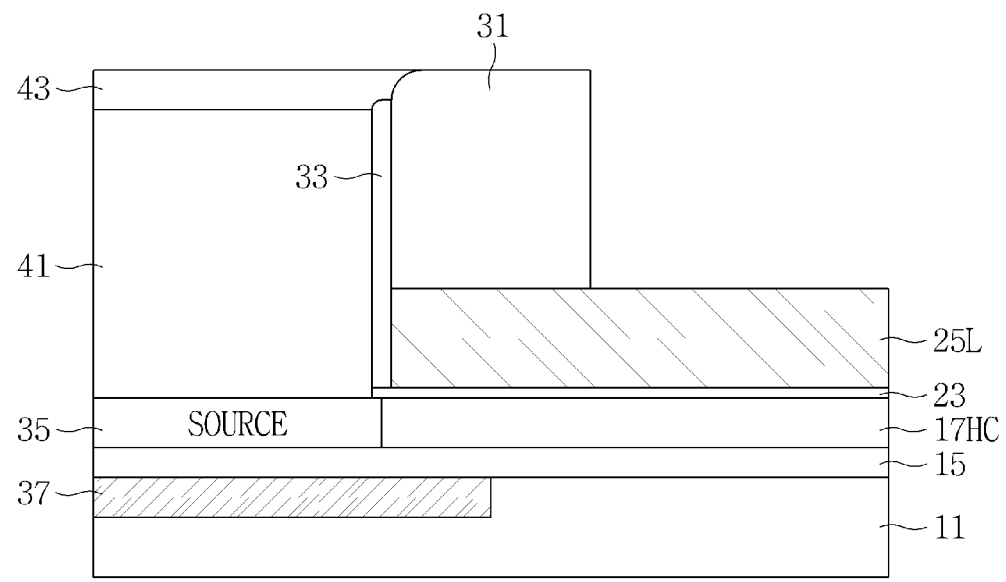

Referring to FIG. 32, the second molding layer 29 and the etch stop layer 27 may be sequentially removed to expose the gate layer 25L.

Figure 33:
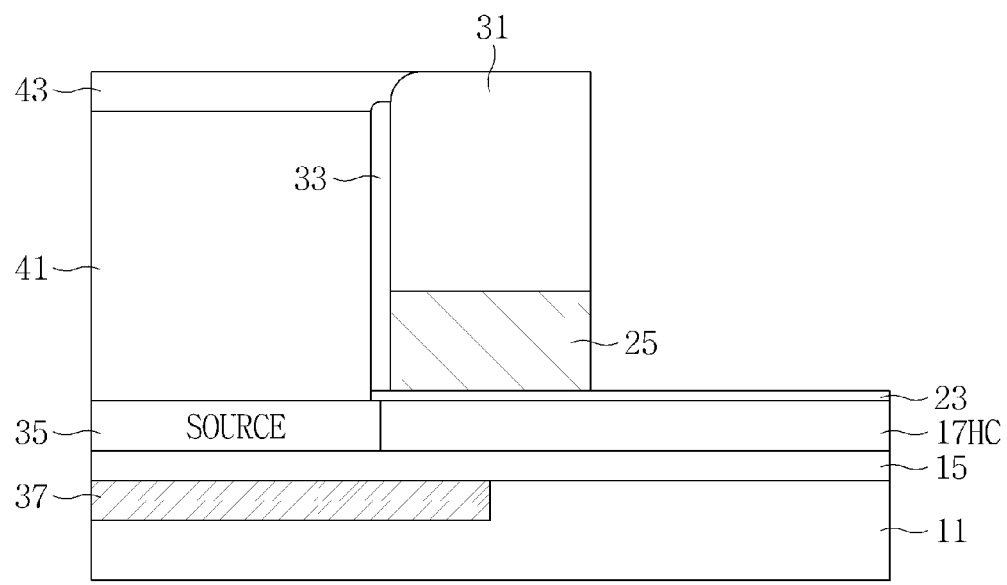

Referring to FIG. 33, the gate layer 25L may be anisotropically etched using the first spacer 31 and the second interlayer insulating layer 43 as an etch mask, thereby forming a gate electrode 25. As a result, the gate electrode 25 may remain present under the first spacer 31. A portion of the gate dielectric layer 23 adjacent to a lateral surface of the gate electrode 25 may be exposed.

Figure 34:
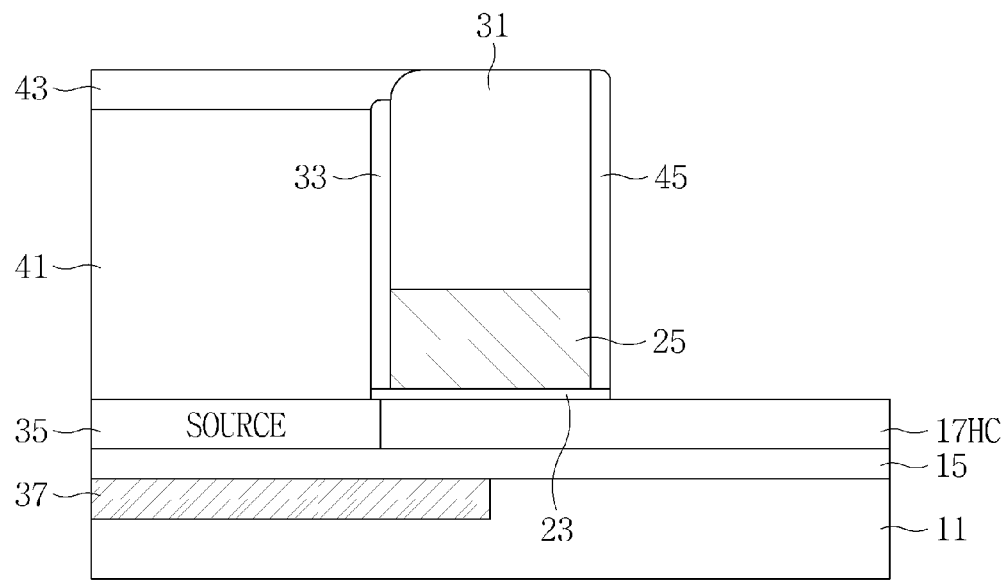

Referring to FIG. 34, a third spacer 45 may be formed on the lateral surface of the gate electrode 25. The third spacer 45 may be formed using a thin-layer forming process and an anisotropic etching process. The third spacer 45 may partially cover the gate dielectric layer 23. The gate dielectric layer 23 may be etched using the third spacer 45, first spacer 31 and the second interlayer insulating layer 43 as an etching mask thereby exposing the top surface of the body 17HC adjacent to the third spacer 45. The third spacer 45 may include silicon oxide, silicon nitride, or a combination thereof.

Figure 35:
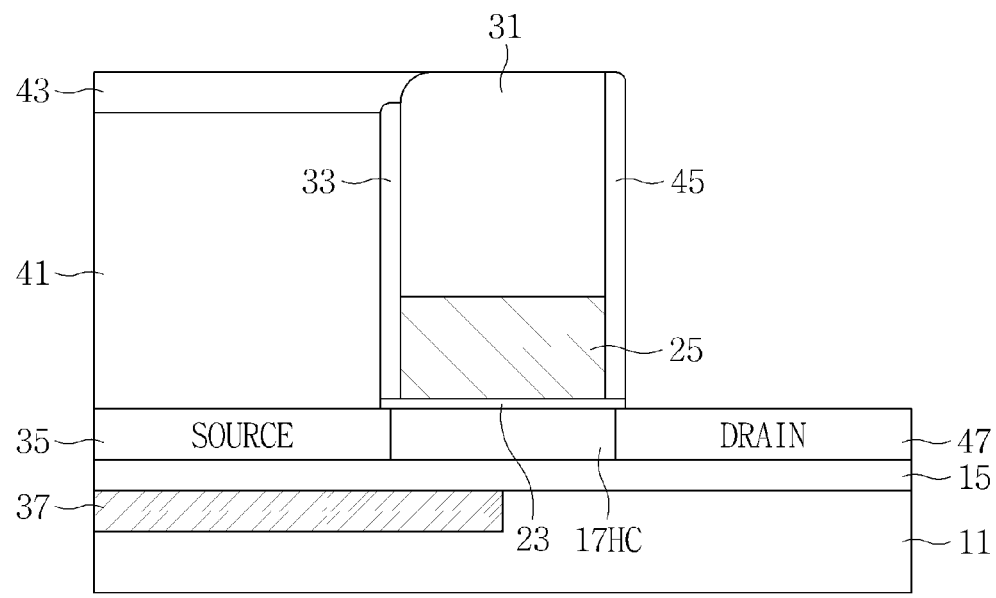

Referring to FIG. 35, a drain 47 may be formed in the body 17HC using an ion implantation process. The body 17HC may remain present under the gate electrode 25. The drain 47 may include impurities of a different conductivity from the body 17HC. For example, the body 17HC may include P-type impurities, while the drain 47 may include N-type impurities.

Figure 36:
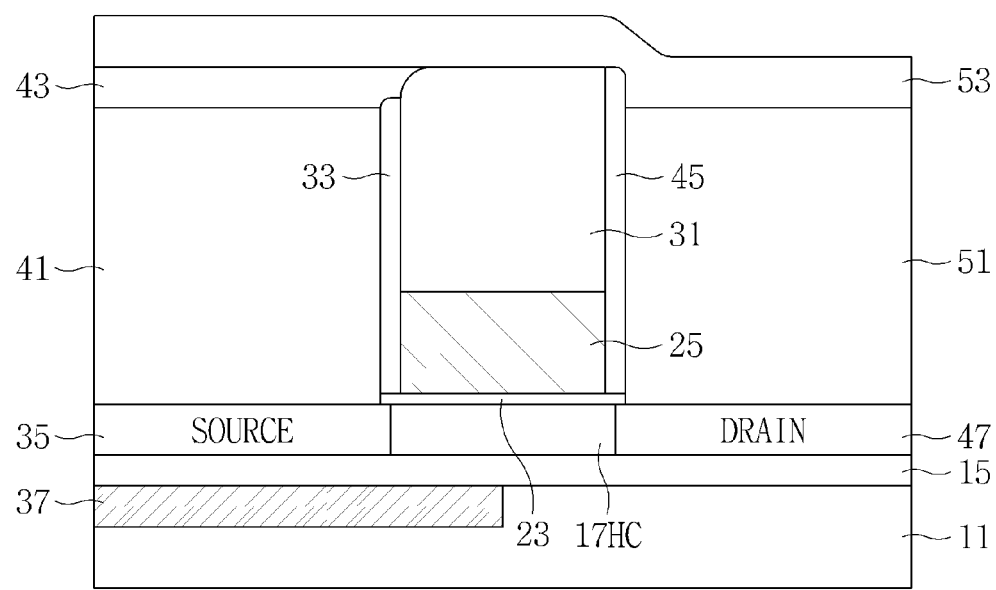

Referring to FIG. 36, a third interlayer insulating layer 51 and a fourth interlayer insulating layer 53 may be sequentially formed on the drain 47. For example, the third interlayer insulating layer 51 may include TEOS. The third interlayer insulating layer 51 may fill concave portions on the substrate 11. The third interlayer insulating layer 51 may be formed on the drain 47 along the third spacer 45. The fourth interlayer insulating layer 53 may include a high-density plasma oxide. The fourth interlayer insulating layer 53 may cover the entire top surface of the substrate 11.

Figure 37:
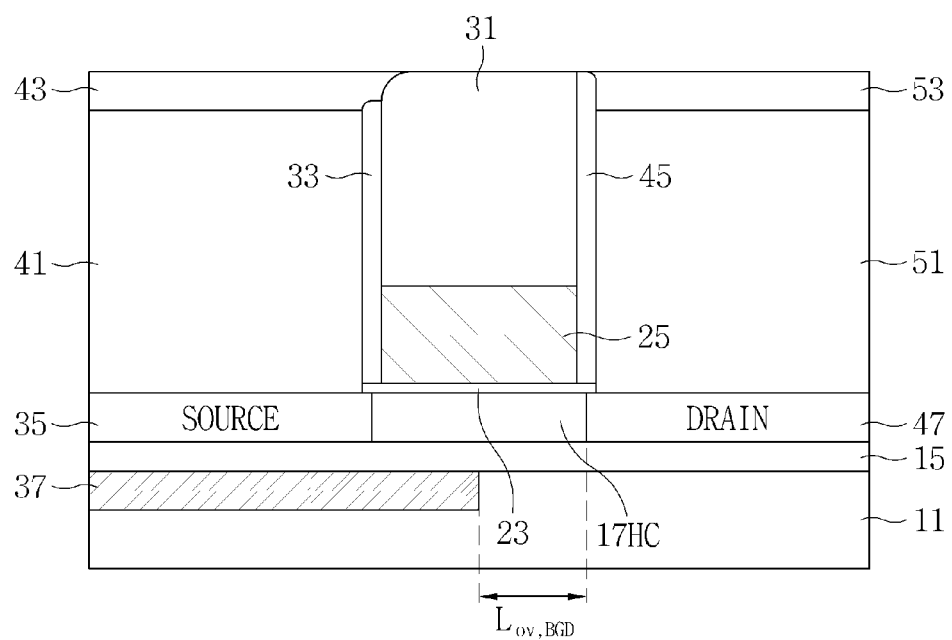

Referring to FIG. 37, the fourth interlayer insulating layer 53 may be planarized to expose the first spacer 31, the second interlayer insulating layer 43 and the third spacer 45. The planarization of the fourth interlayer insulating layer 53 may be performed using a CMP process, an etchback process, or a combination thereof.

The back-bias region 37 may overlap the source 35 and the body 17HC and may not overlap the drain 47. That is, the back-bias region 37 may partially overlap the body 17HC. The back-bias region 37 may be spaced a first distance $L_{OV,BGD}$ apart from a contact surface between the drain 47 and the body 17HC in a horizontal direction. The first offset distance $L_{OV,BGD}$ between the back-bias region 37 and the drain 47 may be about 10 nm or more. A length of an overlap region between the back-bias region 37 and the body 17HC may be less than half the length of the body 17HC.

Figure 38:
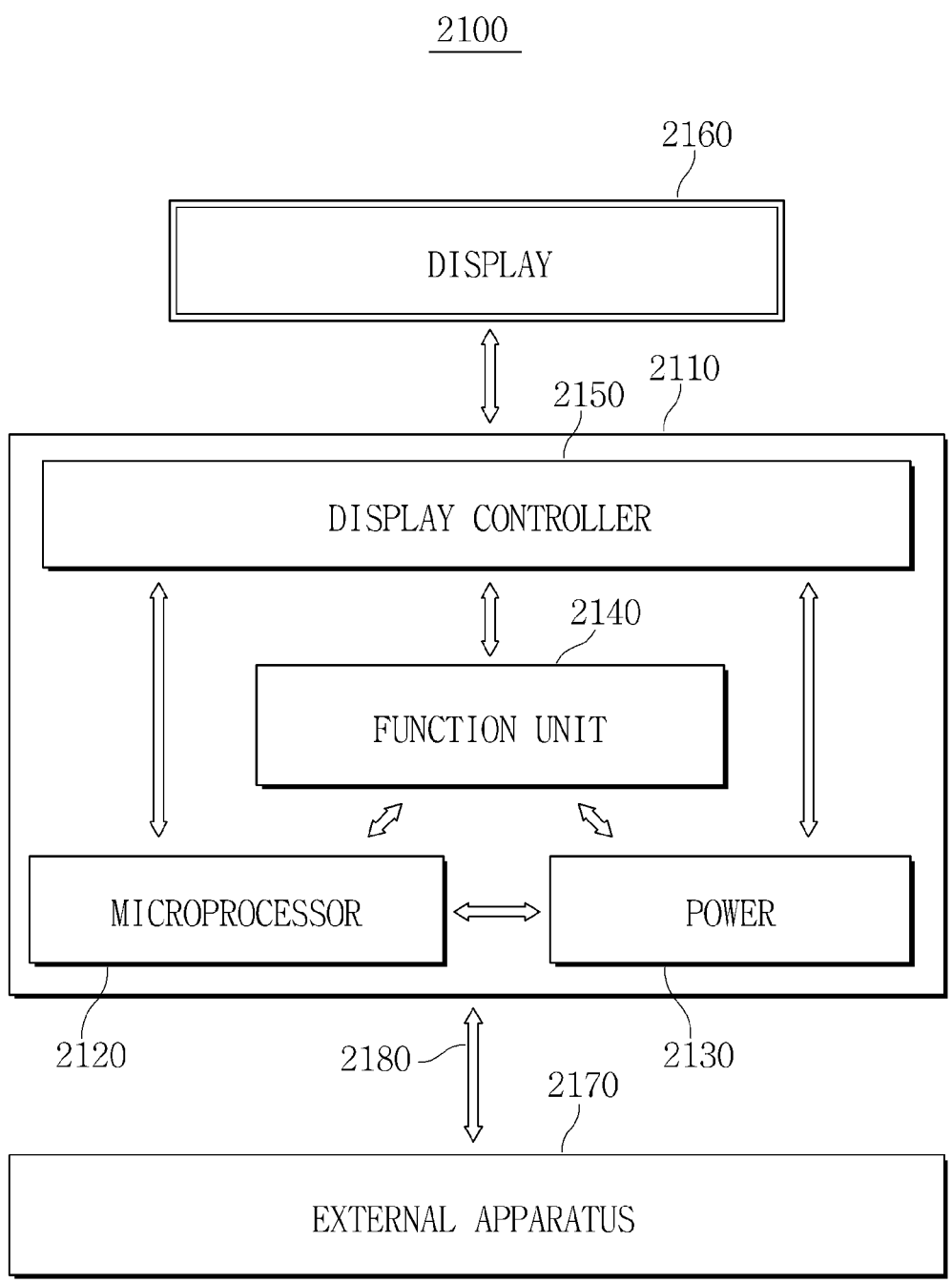
FIG. 38 is a system block diagram of an electronic device according to an example embodiment of the inventive concepts.

FIG. 38 is a system block diagram of an electronic device according to example embodiments of the inventive concepts.

Referring to FIG. 38, a semiconductor device, which is substantially the same as described with reference to FIGS. 1 through 37, may be provided in an electronic system 2100. The electronic system 2100 may include a body 2110, a microprocessor (MP) unit 2120, a power unit 2130, a function unit 2140, and a display controller unit 2150. The body 2110 may include a mother board including a printed circuit board (PCB). The MP unit 2120, the power unit 2130, the function unit 2140, and the display controller unit 2150 may be mounted on the body 2110. A display unit 2160 may be disposed inside or outside the body 2110. For example, the display unit 2160 may be disposed on the surface of the body 2110 and display an image processed by the display controller unit 2150. Alternatively, the display unit 2160 may not be disposed on the surface of the body 2110, as illustrated in FIG. 38.

The power unit 2130 may function to receive a predetermined voltage from an external battery (not shown), divide the voltage into voltages having required voltage levels, and supply the divided voltages to the MP unit 2120, the function unit 2140, and the display controller unit 2150. The MP unit 2120 may receive a voltage from the power unit 2130 and control the function unit 2140 and the display unit 2160. The function unit 2140 may serve various functions of the electronic system 2100. For example, when the electronic system 2100 is a portable phone, the function unit 2140 may include several components capable of serving various functions of the portable phone, for example, outputting an image to the display unit 2160 or outputting a voice to a speaker, by dialing or communicating with an external apparatus 2170. When a camera is also mounted, that is, when the electronic system 2100 includes a camera, the function unit 2140 may serve as a camera image processor.

In an example embodiment, when the electronic system 2100 is connected to a memory card to increase capacity, the function unit 2140 may be a memory card controller. The function unit 2140 may transmit and receive signals to and from the external apparatus 2170 through a wired or wireless communication unit 2180. Furthermore, when the electronic system 2100 requires a universal serial bus (USB) to increase functionality, the function unit 2140 may serve as an interface controller. In addition, the function unit 2140 may include a mass storage device.

A semiconductor device, which is substantially the same as described with reference to FIGS. 1 through 37, may be provided in the function unit 2140 or the MP unit 2120. For example, the function unit 2140 may include the back-bias region 37 and the body 17HC. In this case, the function unit 2140 may exhibit better electrical properties than in the related art, due to the configurations of the back-bias region 37 and the body 17HC. Thus, electrical properties of the electronic system 2100 may be markedly improved as compared with the related art.

According to the example embodiments of the inventive concepts, a back-bias region and a body partially overlapping the back-bias region can be provided. The back-bias region may be offset aligned with a drain. The body may be a hemi-cylindrical nanowire. The use of the back-bias region and the body can be advantageous to controlling a threshold voltage $V_T$ and effectively inhibit an off-state leakage current. As a result, a semiconductor device having excellent electrical properties may be embodied.

The foregoing is illustrative of example embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

What is claimed is:

1. A semiconductor device comprising:
   a back-bias region on a substrate;
   a buried insulating layer covering the substrate and the back-bias region;
   a body on the buried insulating layer, the body configured to partially overlap the back-bias region;
   a drain in contact with the body; and
   a gate electrode covering top and lateral surfaces of the body,
   wherein the back-bias region and drain are spaced apart in a horizontal direction so that the back bias region does not overlap the drain,
   wherein the back-bias region is directly on the substrate such that a top surface of the back-bias region is substantially level with a top surface of the substrate, and
   wherein a length of an overlap region between the back-bias region and the body is less than half a length of the body.

2. The device of claim 1, wherein the back-bias region is spaced at least 10 nm apart from a contact surface between the drain and the body in a horizontal direction.

3. The device of claim 1, wherein the body is a hemi-cylindrical nanowire.

4. The device of claim 1, wherein a bottom surface of the body has a greater width than a top surface of the body.

5. The device of claim 1, wherein the back-bias region is directly on the substrate.

6. The device of claim 1, wherein the back-bias region is a continuous single body having substantially the same impurity concentration.

7. The device of claim 1, further comprising a source in contact with the body and spaced apart from the drain.

8. The device of claim 7, wherein the source overlaps the back-bias region.

9. The device of claim 7, wherein the drain includes N-type impurities, and the source includes P-type impurities.

10. A semiconductor device comprising:
    a back-bias region on a substrate;
    a buried insulating layer covering the substrate and the back-bias region;
    a body on the buried insulating layer, the body configured to overlap the back-bias region;
    a gate electrode on the body; and
    a gate dielectric layer interposed between the body and the gate electrode,
    wherein the buried insulating layer is of a thickness that is greater than a thickness of the gate dielectric layer,
    wherein the body partially overlaps the back-bias region, and the back-bias region and a drain are spaced apart in a horizontal direction so that the back-bias region does not overlap the drain,
    wherein the back-bias region is directly on the substrate such that a top surface of the back-bias region is substantially level with a top surface of the substrate, and
    wherein a length of an overlap region between the back-bias region and the body is less than half a length of the body.

11. The device of claim 10, wherein the back-bias region is spaced at least 10 nm apart from a contact surface between the drain and the body in a horizontal direction.

12. The device of claim 10, wherein the back-bias region has a length greater than or substantially equal to a length of the body.

13. The device of claim 10, wherein the buried insulating layer has a thickness of about 20 nm or less.

\* \* \* \* \*